US010539869B2

(12) United States Patent
Iimura et al.

(10) Patent No.: US 10,539,869 B2
(45) Date of Patent: Jan. 21, 2020

(54) PATTERN FORMING METHOD

(71) Applicant: CANON KABUSHIKI KAISHA, Tokyo (JP)

(72) Inventors: Akiko Iimura, Utsunomiya (JP); Toshiki Ito, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 242 days.

(21) Appl. No.: 15/453,540

(22) Filed: Mar. 8, 2017

(65) Prior Publication Data

US 2017/0285465 A1 Oct. 5, 2017

Related U.S. Application Data

(60) Provisional application No. 62/315,738, filed on Mar. 31, 2016.

(51) Int. Cl.
*G03F 7/00* (2006.01)
*C09D 133/06* (2006.01)
(Continued)

(52) U.S. Cl.
CPC ......... *G03F 7/0002* (2013.01); *C09D 133/06* (2013.01); *C09D 133/08* (2013.01);
(Continued)

(58) Field of Classification Search
CPC ..................................................... G03F 7/0002
See application file for complete search history.

(56) References Cited

U.S. PATENT DOCUMENTS

| | | | |
|---|---|---|---|
| 7,157,036 | B2 | 1/2007 | Choi et al. |
| 7,307,118 | B2 | 12/2007 | Xu et al. |

(Continued)

FOREIGN PATENT DOCUMENTS

| | | |
|---|---|---|
| JP | 2009-208409 A | 9/2009 |
| JP | 2011-159924 A | 8/2011 |

(Continued)

OTHER PUBLICATIONS

International Preliminary Report on Patentability in International Application No. PCT/JP2017/012904 (dated Oct. 2018).

(Continued)

*Primary Examiner* — Benjamin A Schiffman
(74) *Attorney, Agent, or Firm* — Venable LLP

(57) ABSTRACT

A pattern is formed on a substrate with a layer of a curable composition (A1) containing a component (a1) serving as a polymerizable compound on a surface of the substrate, then dispensing droplets of a curable composition (A2) containing at least a component (a2) serving as a polymerizable compound and a component (b2) serving as a photopolymerization initiator dropwise discretely onto the curable composition (A1) layer to lay the droplets, subsequently sandwiching a mixture layer of the curable composition (A1) and the curable composition (A2) between a mold having a pattern and the substrate, then irradiating the mixture layer with light to cure the layer, and releasing the mold from the mixture layer after the curing, a Distance in Hansen space Ra((a1)–(A2)) between the component (a1) serving as a polymerizable compound in the curable composition (A1) and the curable composition (A2) being 6 or less.

26 Claims, 3 Drawing Sheets

(51) Int. Cl.

| | |
|---|---|
| ***C09D 133/08*** | (2006.01) |
| ***G03F 7/16*** | (2006.01) |
| ***C09D 135/02*** | (2006.01) |
| *G03F 7/004* | (2006.01) |
| *G03F 1/80* | (2012.01) |
| *B29K 105/00* | (2006.01) |
| *B29C 59/02* | (2006.01) |

(52) U.S. Cl.

CPC ............. *C09D 135/02* (2013.01); *G03F 7/16* (2013.01); *G03F 7/161* (2013.01); *B29C 2059/023* (2013.01); *B29K 2105/0002* (2013.01); *B29K 2105/0094* (2013.01); *B29K 2909/00* (2013.01); *G03F 1/80* (2013.01); *G03F 7/0045* (2013.01); *G03F 7/0046* (2013.01)

(56) References Cited

U.S. PATENT DOCUMENTS

| | | | | |
|---|---|---|---|---|
| 7,837,921 | B2 | 11/2010 | Xu et al. | |
| 8,142,703 | B2 | 3/2012 | Xu et al. | |
| 8,152,511 | B2 | 4/2012 | Xu et al. | |
| 8,268,220 | B2 | 9/2012 | Xu et al. | |
| 8,557,351 | B2 * | 10/2013 | Xu ......................... | B82Y 10/00 427/553 |
| 8,846,195 | B2 * | 9/2014 | Xu ......................... | B82Y 10/00 427/207.1 |
| 9,475,229 | B2 | 10/2016 | Iida et al. | |
| 9,541,826 | B2 | 1/2017 | Ito et al. | |
| 9,623,439 | B2 | 4/2017 | Ito et al. | |
| 2005/0160934 | A1 | 7/2005 | Xu et al. | |
| 2006/0108710 | A1 | 5/2006 | Xu et al. | |
| 2006/0279024 | A1 | 12/2006 | Choi et al. | |
| 2007/0272825 | A1 | 11/2007 | Xu et al. | |
| 2011/0215503 | A1 | 9/2011 | Xu et al. | |
| 2012/0164395 | A1 | 6/2012 | Ito | |
| 2015/0004790 | A1 | 1/2015 | Murayama et al. | |
| 2015/0075855 | A1 | 3/2015 | Ito et al. | |
| 2015/0086755 | A1 | 3/2015 | Mihara et al. | |
| 2015/0315322 | A1 * | 11/2015 | Chiba ................... | B29C 59/022 264/447 |
| 2015/0368433 | A1 | 12/2015 | Kitagawa et al. | |
| 2016/0009945 | A1 | 1/2016 | Enomoto et al. | |
| 2016/0160003 | A1 | 6/2016 | Kitagawa et al. | |
| 2016/0187774 | A1 | 6/2016 | Ito et al. | |
| 2017/0068159 | A1 * | 3/2017 | Khusnatdinov ....... | G03F 7/0002 |
| 2017/0283620 | A1 | 10/2017 | Otani et al. | |
| 2017/0283632 | A1 | 10/2017 | Chiba et al. | |
| 2017/0285462 | A1 | 10/2017 | Ito | |
| 2017/0285463 | A1 | 10/2017 | Ito et al. | |
| 2017/0285464 | A1 | 10/2017 | Ito et al. | |
| 2017/0285465 | A1 * | 10/2017 | Iimura ................. | C09D 133/06 |
| 2017/0285466 | A1 | 10/2017 | Chiba et al. | |
| 2018/0253000 | A1 * | 9/2018 | Saito ..................... | G03F 7/0002 |
| 2019/0004421 | A1 | 1/2019 | Ito | |
| 2019/0030785 | A1 | 1/2019 | Kato et al. | |

FOREIGN PATENT DOCUMENTS

| | | | | |
|---|---|---|---|---|
| JP | 4791357 B2 | 10/2011 | | |
| JP | 2013-254783 A | 12/2013 | | |
| JP | 2014-076556 A | 5/2014 | | |
| JP | 2014-189616 A | 10/2014 | | |
| JP | 2015-006787 A | 1/2015 | | |
| JP | 5763796 B2 | 8/2015 | | |
| TW | 200923003 A | 6/2009 | | |
| TW | 201439181 A | 10/2014 | | |
| WO | WO-2014084395 A1 * | 6/2014 | ............ | C08F 220/18 |
| WO | 2017/130853 A1 | 8/2017 | | |
| WO | 2017/175668 A1 | 10/2017 | | |

OTHER PUBLICATIONS

Shravanthi Reddy et al., "Simulation of Fluid Flow in the Step and Flash Imprint Lithography Process," 82 Microelectron. Eng. 60-70 (Jul. 2005).

Nobuyuki Imaishi, "Fundamental of the Marangoni Convection," 31 Int. J. Microgravity Sci., Supplement S5-S12 (2014).

Kato et al., U.S. Appl. No. 16/150,939, filed Oct. 3, 2018.

Ito, U.S. Appl. No. 16/042,421, filed Jul. 23, 2018.

Chiba et al. U.S. Appl. No. 15/453,574, filed Mar. 8, 2017.

Otani et al., U.S. Appl. No. 15/453,557, filed Mar. 8, 2017.

Ito et al., U.S. Appl. No. 15/453,521, filed Mar. 8, 2017.

Chiba et al., U.S. Appl. No. 15/426,282, filed Feb. 7, 2017.

Ito et al., U.S. Appl. No. 15/453,504, filed Mar. 8, 2017.

Ito, U.S. Appl. No. 15/453,485, filed Mar. 8, 2017.

* cited by examiner

201

202
201
STEP (1)

203
202
201

203
204
202
201
STEP (2)

205
202
201
STEP (3)

205
206
201

207
205
201
STEP (4)

208
205
201
STEP (5)

PATTERN FORMING METHOD

BACKGROUND OF THE INVENTION

Field of the Invention

The present invention relates to a pattern forming method, a method of producing a processed substrate, a method of producing an optical component, a method of producing a circuit board, a method of producing an electronic component, and a method of producing an imprint mold.

Description of the Related Art

There has been a growing requirement for miniaturization in a semiconductor device, a MEMS, or the like, and hence a photo-nanoimprint technology has been attracting attention as a microfabrication technology.

In the photo-nanoimprint technology, a photocurable composition (resist) is cured in a state in which a mold having a fine groove/land pattern formed on its surface is pressed against a substrate (wafer) having applied thereto the photocurable composition. Thus, the groove/land pattern of the mold is transferred onto the cured film of the photocurable composition and hence the pattern is formed on the substrate. According to the photo-nanoimprint technology, a fine structural body of the order of several nanometers can be formed on the substrate.

A photo-nanoimprint technology disclosed in Japanese Patent No. 4791357 is described with reference to FIGS. 1A through 1F (including FIGS. 1DA and 1FA). First, a liquid resist 102 is dispensed dropwise discretely onto a pattern formation region on a substrate 101 by using an inkjet method (arranging step (1), FIGS. 1A through 1C). Droplets of the resist 102 dispensed dropwise spread on the substrate 101 as indicated by arrows 104 showing the direction in which droplets spread, and the phenomenon is called prespread (FIG. 1C). Next, the resist 102 is molded with a mold 105 that has a pattern formed thereon and is transparent to irradiation light 106 to be described later (mold contacting step (2), FIGS. 1D and 1DA). In the mold contacting step, the droplets of the resist 102 spread over the entire region of a gap between the substrate 101 and the mold 105 as indicated by the arrows 104 showing the direction in which droplets spread (FIG. 1D). The phenomenon is called spread. In addition, in the mold contacting step, the resist 102 is filled into a groove portion on the mold 105 as indicated by the arrows 104 showing the direction in which droplets spread by the capillary phenomenon (FIG. 1DA). The filling phenomenon is called fill. A time period required for the spread and the fill to be completed is called a filling time. After the completion of the filling of the resist 102, the resist 102 is cured by being irradiated with light irradiation 106 (light irradiating step (3), FIG. 1E), and then the substrate 101 is released from the mold 105 (releasing step (4), FIGS. 1F and 1FA). The performance of those steps results in the formation of a photocured film 107 having a predetermined pattern shape (FIG. 1F) on the substrate 101.

In addition, in Japanese Patent No. 5763796, there is a disclosure of an imprint method in which mold releasability is improved by laying two kinds of curable compositions and arranging a curable composition excellent in mold releasability on a mold side.

The photo-nanoimprint technology disclosed in Japanese Patent No. 4791357 has involved a problem in that a time period (filling time) from the initiation of the contact of the mold to the completion of the spread and the fill is long, and hence throughput is low.

SUMMARY OF THE INVENTION

In view of the foregoing, the inventors of the present invention have devised a photo-nanoimprint technology having a short filling time, in other words, high throughput (short spread time nanoimprint lithography, hereinafter referred to as "SST-NIL"). As illustrated in the schematic sectional views of FIGS. 2A through 2H, the SST-NIL includes:

a first laying step (1) of laying a liquid curable composition (A1) 202 on a substrate 201;

a second laying step (2) of laying droplets of a curable composition (A2) 203 discretely on the layer of the curable composition (A1) 202;

a mold contacting step (3) of sandwiching a layer obtained by partially mixing the curable composition (A1) 202 and the curable composition (A2) 203 between a mold 205 having a pattern and the substrate 201;

a light irradiating step (4) of forming a mixture layer 206 obtained by partially mixing the two kinds of curable compositions, followed by the irradiation of the layer with irradiation light 207 from the side of the mold 205 to cure the layer; and a releasing step (5) of releasing the mold 205 from a layer formed of the curable compositions after the curing (a cured film 208 having a pattern shape).

In the SST-NIL, a series of step units ranging from the second laying step (2) to the releasing step (5) is referred to as "shot", and a region where the mold 205 is in contact with the curable compositions (A1) 202 and (A2) 203, in other words, a region where a pattern is formed on the substrate 201 is referred to as "shot region".

In the SST-NIL, the droplets of the curable composition (A2) 203 dispensed dropwise discretely expand quickly on the liquid film of the curable composition (A1) 202 as indicated by arrows 204 showing the direction in which droplets spread, and hence a filling time is short and throughput is high. A detailed mechanism for the SST-NIL is described later.

A problem with the SST-NIL to be solved by the present invention is that the mixing of the two kinds of liquid curable compositions becomes insufficient and hence the composition distribution of the curable compositions occurs in a plane. For example, the case where the two kinds of curable compositions (A1) 202 and (A2) 203 having different curing characteristics do not mix with each other but separate from each other is described with reference to FIGS. 3A through 3D. In FIGS. 3A through 3D, the light irradiating step (4) and the releasing step (5) in FIGS. 2F through 2H are illustrated again, and an etching step (6) is added.

In the light irradiating step (4), first, a mixture layer 306 in which the two kinds of curable compositions separate from each other is formed on a substrate 301, and is irradiated with irradiation light 307 from the side of the mold 305 to form a cured film 308. An inconvenience occurring at the time of the release of the cured film 308 in the releasing step (5) is described. For example, when the curable compositions (A1) 302 and (A2) 303 separate from each other and hence their mixing is insufficient, regions having two kinds of mechanical strengths corresponding to the curable composition (A1) 302 and the curable composition (A2) 303 occur, and hence a mechanical strength distribution occurs. Accordingly, a region having many collapse defects or plug defects occurs. In addition, for example, when the curable composition (A1) 302 is free of a photopolymerization initiator, a photopolymerization initiator in the curable composition (A2) 303 diffuses into the curable composition (A1) 302 to cure the curable composition (A1) 302. When the mixing of the curable composition (A1) 302 and the curable composition (A2) 303 is insufficient, a region having a low photopolymerization initiator concentration occurs in a region having a high concentration of the curable composition (A1) 302, and hence a curing failure or a pattern defect occurs. In addition, when the cured film 308 is etched in the etching step (6), there arises a problem in that the curable composition (A1) 302 that has insufficiently cured is previously removed by the etching, and hence an etching rate distribution occurs.

An object of the present invention is to provide a SST-NIL technology suppressed in in-plane distribution through the use of two kinds of liquid curable compositions that satisfactorily mix with each other.

A pattern forming method according to one embodiment of the present invention includes in this order:

a first laying step (1) of laying a layer formed of a curable composition (A1) containing at least a component (a1) serving as a polymerizable compound on a surface of a substrate;

a second laying step (2) of dispensing droplets of a curable composition (A2) containing at least a component (a2) serving as a polymerizable compound and a component (b2) serving as a photopolymerization initiator dropwise discretely onto the layer formed of the curable composition (A1) to lay the droplets;

a mold contacting step (3) of sandwiching a mixture layer obtained by partially mixing the curable composition (A1) and the curable composition (A2) between a mold having a pattern and the substrate;

a light irradiating step (4) of irradiating the mixture layer with light from the side of the mold to cure the layer; and a releasing step (5) of releasing the mold from the mixture layer after the curing, a Distance in Hansen space Ra((a1)−(A2)) between the component (a1) serving as a polymerizable compound in the curable composition (A1) and the curable composition (A2) being 6 or less.

According to the present invention, there can be provided the SST-NIL technology suppressed in in-plane distribution through the use of two kinds of liquid curable compositions that satisfactorily mix with each other.

Further features of the present invention will become apparent from the following description of exemplary embodiments with reference to the attached drawings.

DESCRIPTION OF THE EMBODIMENTS

Figures 1A, 1B, 1C, 1D, 1E, 1F:
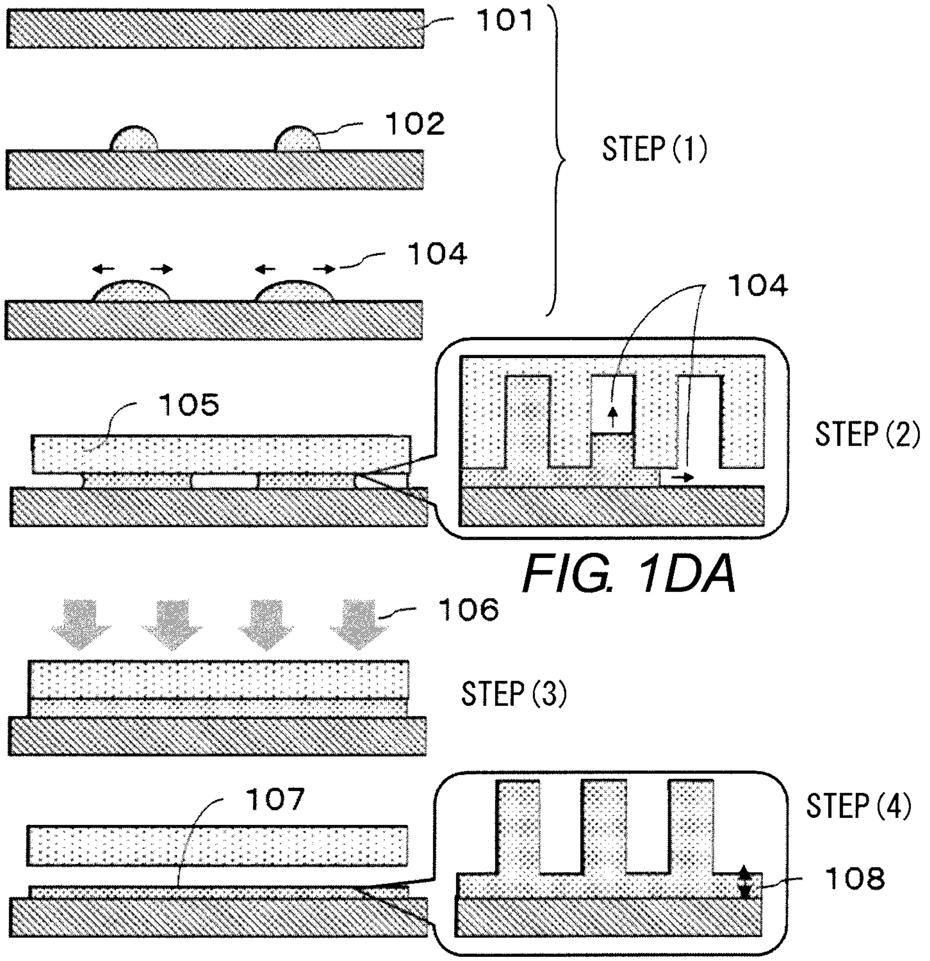
FIGS. 1A, 1B, 1C, 1D, 1DA, 1E, 1F and 1FA are schematic sectional views for illustrating a precedent for a photo-nanoimprint technology.

An embodiment of the present invention is described in detail below with reference to the drawings as appropriate. However, the present invention is not limited to the embodiment to be described below. Appropriate modifications, improvements, and the like of the embodiment to be described below that do not deviate from the gist of the present invention and are based on the ordinary knowledge of a person skilled in the art are also included in the scope of the present invention. In addition, a component (a) contained in the curable composition (A1) is written as a component (a1), and a component (a) contained in the curable composition (A2) is written as a component (a2). The same applies to a component (b) through (d).

[Curable Composition]

Curable compositions (A1) and (A2) according to this embodiment are each a composition containing at least a component (a) serving as a polymerizable compound. The curable compositions according to this embodiment may each further contain a component (b) serving as a photopolymerization initiator, a component (c) serving as a non-polymerizable compound, and a component (d) serving as a solvent.

In addition, the term "cured film" as used herein means a film obtained by polymerizing and curing a curable composition on a substrate. The shape of the cured film is not particularly limited, and the film may have a pattern shape on its surface.

Each component is hereinafter described in detail.

<Component (a): Polymerizable Compound>

The component (a) is a polymerizable compound. The polymerizable compound as used herein is a compound that reacts with a polymerizing factor (such as a radical) generated from the component (b) serving as a photopolymerization initiator to form a film formed of a polymer compound by a chain reaction (polymerization reaction).

As such polymerizable compound, there is given, for example, a radical polymerizable compound. The component (a) serving as a polymerizable compound may be formed of only one kind of polymerizable compound or a plurality of kinds of polymerizable compounds.

It is preferred that the radical polymerizable compound be a compound having one or more acryloyl groups or methacryloyl groups, that is, a (meth)acrylic compound. Therefore, it is preferred that the curable compositions according to this embodiment each contain the (meth)acrylic compound as the component (a), it is more preferred that a main component for the component (a) be the (meth)acrylic compound, and it is most preferred that the entirety of the component (a) be the (meth)acrylic compound. The phrase "a main component for the component (a) is the (meth) acrylic compound" described herein means that the (meth) acrylic compound accounts for 90 wt % or more of the component (a).

When the radical polymerizable compound includes a plurality of kinds of compounds each having one or more acryloyl groups or methacryloyl groups, the component (a) preferably contains a monofunctional (meth)acrylic monomer and a polyfunctional (meth)acrylic monomer. This is because the combination of the monofunctional (meth) acrylic monomer and the polyfunctional (meth)acrylic monomer provides a cured film having a high mechanical strength.

Monofunctional (meth)acrylic compounds having one acryloyl group or methacryloyl group are exemplified by, but not limited to, phenoxyethyl (meth)acrylate, phenoxy-2-methylethyl (meth)acrylate, phenoxyethoxyethyl (meth) acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, (meth)acrylate of EO-modified p-cumylphenyl, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxy diethylene glycol (meth)acrylate, polyethylene glycol mono(meth) acrylate, polypropylene glycol mono(meth)acrylate, methoxy ethylene glycol (meth)acrylate, ethoxyethyl (meth) acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products corresponding to the monofunctional (meth)acrylic compounds include, but not limited to: Aronix (trademark) M101, M102, M110, M111, M113, M117, M5700, TO-1317, M120, M150, and M156 (all of which are manufactured by Toagosei Co., Ltd); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of which are manufactured by Osaka Organic Chemical Industry Ltd.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of which are manufactured by Kyoeisha Chemical Co., Ltd.); KAYARAD (trademark) TC110S, R-564, and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A, and 513A (all of which are manufactured by Hitachi Chemical Co., Ltd.); PHE, CEA, PHE-2, PHE-4, BR-31, BR-31M, and BR-32 (all of which are manufactured by Dai-ichi Kogyo Seiyaku Co., Ltd.); VP (manufactured by BASF); and ACMO, DMAA, and DMAPAA (all of which are manufactured by Kohjin Co., Ltd.).

In addition, polyfunctional (meth)acrylic compounds having two or more acryloyl groups or methacryloyl groups are exemplified by, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth) acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, tris(2-hydroxyethyl)isocyanurate tri(meth)acrylate, tris(acryloyloxy) isocyanurate, bis(hydroxymethyl)tricyclodecane di(meth) acrylate, dipentaerythritol penta(meth)acrylate, dipentaerythritol hexa(meth)acrylate, EO-modified 2,2-bis (4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercial products corresponding to the polyfunctional (meth)acrylic compounds include, but not limited to: Upimer (trademark) UV SA1002 and SA2007 (both of which are manufactured by Mitsubishi Chemical Corporation); Viscoat #195, #230, #215, #260, #335HP, #295, #300, #360, #700, GPT, and 3PA (all of which are manufactured by Osaka Organic Chemical Industry Ltd.); Light Acrylate 4EG-A, 9EG-A, NP-A, DCP-A, BP-4EA, BP-4PA, TMP-A, PE-3A, PE-4A, and DPE-6A (all of which are manufactured by Kyoeisha Chemical Co., Ltd.); KAYARAD (trademark) PET-30, TMPTA, R-604, DPHA, DPCA-20, -30, -60, and -120, and HX-620, D-310, and D-330 (all of which are manufactured by Nippon Kayaku Co., Ltd.); Aronix (trademark) M208, M210, M215, M220, M240, M305, M309, M310, M315, M325, and M400 (all of which are manufactured by Toagosei Co., Ltd); and Lipoxy (trademark) VR-77, VR-60, and VR-90 (all of which are manufactured by Showa Highpolymer Co., Ltd.).

In the above-mentioned compound group, the term "(meth)acrylate" means an acrylate or a methacrylate having an alcohol residue equal to the acrylate. The term "(meth) acryloyl group" means an acryloyl group or a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound A are bonded to each other through a block structure of an ethylene oxide group. Further, the abbreviation "PO" refers to propylene oxide, and the term "PO-modified compound B" means a compound in which a (meth)acrylic acid residue and an alcohol residue of the compound B are bonded to each other through a block structure of a propylene oxide group.

The blending ratio of the component (a1) serving as a polymerizable compound in the curable composition (A1) is desirably 50 wt % or more and 100 wt % or less with respect to the total weight of the component (a1), the component (b1), and the component (c1), i.e., the total weight of the components of the curable composition (A1) except the component (d1) serving as a solvent. In addition, the blending ratio is preferably 80 wt % or more and 100 wt % or less, more preferably more than 90 wt % and 100 wt % or less.

When the blending ratio of the component (a1) serving as a polymerizable compound in the curable composition (A1) is set to 50 wt % or more with respect to the total weight of the component (a1), the component (b1), and the component (c1), a cured film to be obtained can be turned into a cured film having some degree of mechanical strength.

The blending ratio of the component (a2) serving as a polymerizable compound in the curable composition (A2) is desirably 50 wt % or more and 99.9 wt % or less with respect to the total weight of the component (a2), the component (b2), and the component (c2), i.e., the total weight of the components of the curable composition (A2) except the component (d2) serving as a solvent. In addition, the blending ratio is preferably 80 wt % or more and 99 wt % or less, more preferably more than 90 wt % and 98 wt % or less.

When the blending ratio of the component (a2) serving as a polymerizable compound in the curable composition (A2) is set to 50 wt % or more with respect to the total weight of the component (a2), the component (b2), and the component (c2), a cured film to be obtained can be turned into a cured film having some degree of mechanical strength.

In addition, as described below, it is preferred that the curable composition (A1) contain the component (d1). The blending ratio of the component (a1) in the curable composition (A1) is desirably 0.01 wt % or more and 10 wt % or less with respect to the total weight of the components of the curable composition (A1) containing the component (d1) serving as a solvent.

<Component (b): Photopolymerization Initiator>

The component (b) is a photopolymerization initiator.

The photopolymerization initiator as used herein is a compound that detects light having a predetermined wavelength to generate the above-mentioned polymerizing factor (radical). Specifically, the photopolymerization initiator is a polymerization initiator (radical generator) that generates a radical with light (an infrared ray, a visible ray, an ultraviolet ray, a far ultraviolet ray, an X-ray, a charged particle ray such as an electron beam, or a radiation ray).

The component (b) may be formed of one kind of photopolymerization initiator or a plurality of kinds of photopolymerization initiators.

Examples of the radical generator include, but not limited to: 2,4,5-triarylimidazole dimers that may have a substituent such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives such as 2-benzyl-2-dimethylamino-1-(4-morpholinophenyl)-butanone-1,2-methyl-1-[4-(methylthio)phenyl]-2-morpholino-propan-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin and benzoin derivatives such as methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone and acetophenone derivatives such as 3-methylacetophenone, acetophenone benzyl ketal, 1-hydroxycyclohexyl phenyl ketone, and 2,2-dimethoxy-2-phenylacetophenone; thioxanthone and thioxanthone derivatives such as diethylthioxanthone, 2-isopropylthioxanthone, and 2-chlorothioxanthone; acylphosphine oxide derivatives such as 2,4,6-trimethylbenzoyl diphenyl phosphine oxide, bis(2,4,6-trimethylbenzoyl) phenyl phosphine oxide, and bis-(2,6-dimethoxybenzoyl)-2,4,4-trimethylpentyl phosphine oxide; oxime ester derivatives such as 1,2-octanedione-1-[4-(phenylthio)phenyl]-2-(O-benzoyloxime) and ethanone-1-[9-ethyl-6-(2-methylbenzoyl)-9H-carbazol-3-yl]-1-(O-acetyloxime); xantone; fluorenone; benzaldehyde; fluorene; anthraquinone; triphenylamine; carbazole; 1-(4-isopropylphenyl)-2-hydroxy-2-methylpropan-1-one; and 2-hydroxy-2-methyl-1-phenylpropan-1-one.

Examples of commercial products corresponding to the radical generator include, but not limited to, Irgacure 184, 369, 651, 500, 819, 907, 784, and 2959, CGI-1700, -1750, and -1850, CG24-61, Darocur 1116 and 1173, Lucirin (trademark) TPO, LR8893, and LR8970 (all of which are manufactured by BASF), and Ubecryl P36 (manufactured by UCB).

Of those, the component (b) is preferably an acylphosphine oxide-based polymerization initiator. The acylphosphine oxide-based polymerization initiator is, of the examples described above, an acylphosphine oxide compound such as 2,4,6-trimethylbenzoyl diphenyl phosphine oxide, bis(2,4,6-trimethylbenzoyl) phenyl phosphine oxide, or bis(2,6-dimethoxybenzoyl)-2,4,4-trimethylpentyl phosphine oxide.

In the present invention, it is preferred that the curable composition (A1) be substantially free of photoreactivity. To this end, the blending ratio of the component (b1) serving as a photopolymerization initiator in the curable composition (A1) is preferably less than 0.1 wt % with respect to the total weight of the component (a1), the component (b1), and the component (c1) to be described later, i.e., the total weight of the components of the curable composition (A1) except the component (d1) serving as a solvent. In addition, the blending ratio is more preferably 0.01 wt % or less.

When the blending ratio of the component (b1) in the curable composition (A1) is set to less than 0.1 wt % with respect to the total weight of the component (a1), the component (b1), and the component (c1), the curable composition (A1) is substantially free of photoreactivity, and hence a problem in that the curable composition (A1) laid outside the shot is photocured by irradiation light leaking to the outside of the shot region can be prevented.

The blending ratio of the component (b2) serving as a photopolymerization initiator in the curable composition (A2) is desirably 0.1 wt % or more and 50 wt % or less with respect to the total weight of the component (a2), the component (b2), and the component (c2) to be described later, i.e., the total weight of the components of the curable composition (A2) except the component (d2) serving as a solvent. In addition, the blending ratio is preferably 0.1 wt % or more and 20 wt % or less, more preferably 1 wt % or more and 10 wt % or less.

When the blending ratio of the component (b2) in the curable composition (A2) is set to 0.1 wt % or more with respect to the total weight of the component (a2), the component (b2), and the component (c2), the curing rate of the composition increases and hence reaction efficiency can be improved. In addition, when the blending ratio of the component (b2) is set to 50 wt % or less with respect to the total weight of the component (a2), the component (b2), and the component (c2), a cured film to be obtained can be turned into a cured film having some degree of mechanical strength.

<Component (c): Non-Polymerizable Compound>

The curable compositions (A1) and (A2) according to this embodiment can each further contain the component (c) serving as a non-polymerizable compound in addition to the component (a) and the component (b) described in the foregoing in accordance with various purposes to the extent that the effects of the present invention are not impaired. Such component (c) is, for example, a compound that is free of a polymerizable functional group such as a (meth)acryloyl group, and is free of an ability to sense light having a predetermined wavelength to generate the polymerizing factor (radical). Examples thereof include a sensitizer, a hydrogen donor, an internal addition-type release agent, a surfactant, an antioxidant, a polymer component, and other additives. Two or more kinds of the compounds may be incorporated as the component (c).

The sensitizer is a compound to be appropriately added for the purpose of accelerating a polymerization reaction or enhancing a reaction conversion ratio. As the sensitizer, there is given, for example, a sensitizing dye.

The sensitizing dye is a compound that is excited by absorbing light having a specific wavelength to interact with the component (b) serving as a polymerization initiator. The term "interaction" described herein refers to, for example, the transfer of energy or an electron from the sensitizing dye in an excited state to the component (b) serving as a polymerization initiator.

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

One kind of the sensitizers may be used alone, or two or more kinds thereof may be used as a mixture.

The hydrogen donor is a compound capable of reacting with an initiation radical generated from the component (b) serving as a polymerization initiator or the radical of a polymerization growth terminal to generate a more reactive radical. The hydrogen donor is preferably added when the component (b) serving as a polymerization initiator is a photoradical generator.

Specific examples of such hydrogen donor include, but not limited to, amine compounds such as n-butylamine, di-n-butylamine, allylthiourea, triethylamine, triethylenetetramine, a 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, and mercapto compounds such as 2-mercapto-N-phenylbenzimidazole and a mercaptopropionic acid ester, sulfur compounds, such as s-benzylisothiuronium-p-toluenesulfinate, and phosphorous compounds, such as tri-n-butylphosphine.

One kind of the hydrogen donors may be used alone, or two or more kinds thereof may be used as a mixture. In addition, the hydrogen donor may have a function as a sensitizer.

The internal addition-type release agent can be added to each of the curable compositions for the purpose of reducing an interfacial bonding force between a mold and a resist, i.e., reducing a release force in a releasing step to be described later. The term "internal addition-type" as used herein means that the release agent is added to the curable composition prior to the step of arranging the curable composition.

For example, surfactants such as a silicone-based surfactant, a fluorine-based surfactant, and a hydrocarbon-based surfactant, can each be used as the internal addition-type release agent. In the present invention, the internal addition-type release agent is free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group, or a thiol group on part (for example, as a terminal group) of its molecular structure.

As the fluorine-based surfactant, a commercial product may be used. Examples of the commercial product include MEGAFAC (trademark) F-444, TF-2066, TF-2067, and TF-2068 (all of which are manufactured by DIC Corporation), Fluorad FC-430 and FC-431 (both of which are manufactured by Sumitomo 3M Limited), Surflon (trademark) S-382 (manufactured by AGC), EFTOP EF-122A, 122B, and 122C, EF-121, EF-126, EF-127, and MF-100 (all of which are manufactured by Tohkem Products Corp.), PF-636, PF-6320, PF-656, and PF-6520 (all of which are manufactured by OMNOVA Solutions), UNIDYNE (trademark) DS-401, DS-403, and DS-451 (all of which are manufactured by Daikin Industries, Ltd.), and Ftergent (trademark) 250, 251, 222F, and 208G (all of which are manufactured by Neos Corporation).

In addition, the internal addition-type release agent may be the hydrocarbon-based surfactant.

The hydrocarbon-based surfactant includes, for example, an alkyl alcohol polyalkylene oxide adduct, in which an alkylene oxide having 2 to 4 carbon atoms is added to an alkyl alcohol having 1 to 50 carbon atoms.

Examples of the alkyl alcohol polyalkylene oxide adduct include a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, and a stearyl alcohol ethylene oxide/propylene oxide adduct. The terminal group of the alkyl alcohol polyalkylene oxide adduct is not limited to a hydroxyl group, which is simply produced by adding a polyalkylene oxide to an alkyl alcohol. The hydroxyl group may be substituted with another substituent, for example, a polar functional group such as a carboxyl group, an amino group, a pyridyl group, a thiol group, or a silanol group, or a hydrophobic functional group such as an alkyl group or an alkoxy group.

As the alkyl alcohol polyalkylene oxide adduct, a commercial product may be used. Examples of the commercial product include polyoxyethylene methyl ether (methyl alcohol ethylene oxide adduct) (BLAUNON MP-400, MP-550, and MP-1000) manufactured by Aoki Oil Industrial Co., Ltd., polyoxyethylene decyl ether (decyl alcohol ethylene oxide adduct) (FINESURF D-1303, D-1305, D-1307, and D-1310) manufactured by Aoki Oil Industrial Co., Ltd., polyoxyethylene lauryl ether (lauryl alcohol ethylene oxide adduct) (BLAUNON EL-1505) manufactured by Aoki Oil Industrial Co., Ltd., polyoxyethylene cetyl ether (cetyl alcohol ethylene oxide adduct) (BLAUNON CH-305 and CH-310) manufactured by Aoki Oil Industrial Co., Ltd., polyoxyethylene stearyl ether (stearyl alcohol ethylene oxide adduct) (BLAUNON SR-705, SR-707, SR-715, SR-720, SR-730, and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol (trademark) A760E) manufactured by BASF, and polyoxyethylene alkyl ethers (EMULGEN Series) manufactured by Kao Corporation.

Of those hydrocarbon-based surfactants, the alkyl alcohol polyalkylene oxide adduct is preferred as the internal addition-type release agent, and a long-chain alkyl alcohol polyalkylene oxide adduct is more preferred.

One kind of the internal addition-type release agents may be used alone, or two or more kinds thereof may be used as a mixture.

The blending ratio of the component (c) serving as a non-polymerizable compound in each of the curable compositions is desirably 0 wt % or more and 50 wt % or less with respect to the total weight of the component (a), the component (b), and the component (c) to be described later, i.e., the total weight of the components of the curable compositions except the solvent. In addition, the blending ratio is preferably 0.1 wt % or more and 50 wt % or less, more preferably 0.1 wt % or more and 20 wt % or less.

When the blending ratio of the component (c) is set to 50 wt % or less with respect to the total weight of the component (a), the component (b), and the component (c), a cured film to be obtained can be turned into a cured film having some degree of mechanical strength.

<Component (d): Solvent>

The curable compositions according to this embodiment may each contain a component (d) serving as a solvent. The component (d) is not particularly limited as long as the component is a solvent that dissolves the component (a), the component (b), and the component (c). The solvent is preferably a solvent having a boiling point at normal pressure of 80° C. or more and 200° C. or less. The solvent is more preferably a solvent having at least one of an ester structure, a ketone structure, a hydroxyl group, or an ether structure. The solvent is specifically, for example, a single solvent selected from propylene glycol monomethyl ether acetate, propylene glycol monomethyl ether, cyclohexanone, 2-heptanone, γ-butyrolactone, and ethyl lactate, or a mixed solvent of two or more kinds thereof.

The curable composition (A1) according to this embodiment preferably contains the component (d1). This is because, as described later, a spin coating method is preferred as a method of applying the curable composition (A1) onto the substrate.

<Hansen Solubility Parameter of Curable Composition>

The extent to which the two curable compositions mix with each other can be represented by a Distance in Hansen space Ra using a Hansen solubility parameter to be described later. A smaller Distance in Hansen space Ra means that the compositions more easily mix with each other. A Distance in Hansen space Ra((a1)−(A2)) between the component (a1) serving as a polymerizable compound in the curable composition (A1) and the curable composition (A2) in the present invention is preferably 6 or less. The distance is more preferably 3 or less. When the Distance in Hansen space Ra((a1)−(A2)) is 6 or less, preferably 3 or less, quick mixing and the uniformity of a cured product are obtained. Meanwhile, when the Distance in Hansen space Ra((a1)−(A2)) is more than 6, the curable compositions (A1) and (A2) hardly mix with each other, and hence the quick mixing is inhibited and the homogeneity of the cured product is impaired.

In addition, the Distance in Hansen space Ra((a1)−(A2)) between the component (a1) serving as a polymerizable compound in the curable composition (A1) and the curable composition (A2) described herein is defined by the formula (1).

$$Ra=(4(\delta d(a1)-\delta d(A2))^2+(\delta p(a1)-\delta p(A2))^2+(\delta h(a1)-\delta h(A2))^2)^{1/2} \quad \text{Formula (1)}$$

In the formula (1), the dispersion term, polarity term, and hydrogen bonding term of the Hansen solubility parameter of the component (a1) serving as a polymerizable compound in the curable composition (A1) were represented by δd(a1), δp(a1), and δh(a1) [unit: $(MPa)^{1/2}$], respectively, and the dispersion term, polarity term, and hydrogen bonding term of the Hansen solubility parameter of the curable composition (A2) were represented by δd(A2), δp(A2), and δh(A2) [unit: $(MPa)^{1/2}$], respectively.

A Hansen solubility parameter can be calculated with, for example, software for calculating a Hansen solubility parameter from a chemical structure "Hansen Solubility Parameters in Practice (HSPiP) 4th Edition. 4.0.05." In addition, the Hansen solubility parameter of a composition formed of a plurality of kinds of compounds is calculated based on the volume ratio of the Hansen solubility parameter of an individual compound.

In addition, as a result of partial mixing of the curable composition (A1) and the curable composition (A2), the component (b2) serving as a photopolymerization initiator in the curable composition (A2) migrates to the curable composition (A1). When the curable composition (A1) alone is free of photoreactivity, the curable composition (A1) does not obtain photoreactivity until the component (b2) serving as a photopolymerization initiator in the curable composition (A2) migrates. Therefore, when the component (b2) serving as a photopolymerization initiator in the curable composition (A2) has such a property as to more easily dissolve in the component (a1) serving as a polymerizable compound in the curable composition (A1) than in the component (a2) serving as a polymerizable compound in the curable composition (A2), the quick mixing and the uniformity of the cured product are obtained.

In addition, a Distance in Hansen space Ra((a2)−(b2)) between the component (a2) serving as a polymerizable compound in the curable composition (A2) and the component (b2) serving as a photopolymerization initiator described herein is defined by the formula (2), and a Distance in Hansen space Ra((a1)−(b2)) between the component (a1) serving as a polymerizable compound in the curable composition (A1) and the component (b2) serving as a photopolymerization initiator in the curable composition (A2) is defined by the formula (3).

$$Ra((a2)-(b2))=(4(\delta d(a2)-\delta d(b2))^2+(\delta p(a2)-\delta p(b2))^2+(\delta h(a2)-\delta h(b2))^2)^{1/2} \quad \text{Formula (2)}$$

$$Ra((a1)-(b2))=(4(\delta d(a1)-\delta d(b2))^2+(\delta p(a1)-\delta p(b2))^2+(\delta h(a1)-\delta h(b2))^2)^{1/2} \quad \text{Formula (3)}$$

In addition, when the formula (2) and the formula (3) satisfy a relationship represented by the following formula (4), the component (a2) serving as a polymerizable compound in the curable composition (A2) more easily dissolve in the component (a1) serving as a polymerizable compound in the curable composition (A1) than in the component (a2) serving as a polymerizable compound in the curable composition (A2).

$$\text{Formula (3) } Ra((a1)-(b2)) < \text{Formula (2) } Ra((a2)-(b2)) \quad \text{Formula (4)}$$

In the formula (2) and the formula (3), the dispersion term, polarity term, and hydrogen bonding term of the Hansen solubility parameter of the component (a1) serving as a polymerizable compound in the curable composition (A1) were represented by δd(a1), δp(a1), and δh(a1) [(MPa)$^{1/2}$], respectively, and the dispersion term, polarity term, and hydrogen bonding term of the Hansen solubility parameter of the component (a2) serving as a polymerizable compound in the curable composition (A2) were represented by δd(a2), δp(a2), and δh(a2) [(MPa)$^{1/2}$], respectively. In addition, the dispersion term, polarity term, and hydrogen bonding term of the Hansen solubility parameter of the component (b2) serving as a photopolymerization initiator in the curable composition (A2) were represented by δd(b2), δp(b2), and δh(b2) [(MPa)$^{1/2}$], respectively.

<Temperature at Time of Blending of Curable Composition>

When the curable compositions (A1) and (A2) of this embodiment are prepared, each component is mixed and dissolved under a predetermined temperature condition. Specifically, the preparation is performed in a range of from 0° C. or more to 100° C. or less.

<Viscosity of Curable Composition>

The curable compositions (A1) and (A2) according to this embodiment are preferably liquid. This is because in a mold contacting step to be described later, the spread and fill of the curable composition (A1) and/or the curable composition (A2) are quickly completed, in other words, a filling time is short.

The viscosity of the composition of the components of the curable composition (A1) except the component (d1) of serving as a solvent according to this embodiment at 25° C. is preferably 1 mPa·s or more and 1,000 mPa·s or less. In addition, the viscosity is more preferably 1 mPa·s or more and 500 mPa·s or less, still more preferably 1 mPa·s or more and 100 mPa·s or less.

The viscosity of the composition of the components of the curable composition (A2) except the component (d2) serving as a solvent according to this embodiment at 25° C. is preferably 1 mPa·s or more and 100 mPa·s or less. In addition, the viscosity is more preferably 1 mPa·s or more and 50 mPa·s or less, still more preferably 1 mPa·s or more and 12 mPa·s or less.

When the viscosities of the curable compositions (A1) and (A2) are set to 100 mPa·s or less, spread and fill are quickly completed at the time of the bringing of the curable compositions (A1) and (A2) into contact with the mold (S. Reddy, R. T. Bonnecaze/Microelectronic Engineering, (2005) 60-70). In other words, when the curable compositions according to this embodiment are used, a photo-nanoimprint method can be performed at high throughput. In addition, a pattern defect due to a filling failure hardly occurs.

In addition, when the viscosities are set to 1 mPa·s or more, application unevenness hardly occurs at the time of the application of the curable compositions (A1) and (A2) onto the substrate. Further, when the curable compositions (A1) and (A2) are brought into contact with the mold, the curable compositions (A1) and (A2) hardly flow out of an end portion of the mold.

<Surface Tension of Curable Composition>

With regard to the surface tension of each of the curable compositions (A1) and (A2) according to this embodiment, the surface tension of the composition of the components of the curable compositions (A1) and (A2) except the component (d) serving as a solvent at 23° C. is preferably 5 mN/m or more and 70 mN/m or less. In addition, the surface tension is more preferably 7 mN/m or more and 50 mN/m or less, still more preferably 10 mN/m or more and 40 mN/m or less. In this case, as the surface tension becomes higher, e.g., 5 mN/m or more, a stronger capillary force acts, and hence filling (the spread and the fill) is completed within a shorter time period at the time of the bringing of the curable composition (A1) and/or the curable composition (A2) into contact with the mold (S. Reddy, R. T. Bonnecaze/Microelectronic Engineering, 82 (2005) 60-70).

In addition, when the surface tension is set to 70 mN/m or less, a cured film obtained by curing the curable compositions becomes a cured film having surface smoothness.

In this embodiment, the surface tension of a composition of the components of the curable composition (A1) except the component (d1) serving as a solvent is preferably higher than the surface tension of a composition of the components of the curable composition (A2) except the solvent component (d2) serving as a solvent. This is because of the following reason. Before the mold contacting step, the prespread of the curable composition (A2) is accelerated (droplets spread over a wide range) by a Marangoni effect to be described later, and hence a time period required for spread in the mold contacting step to be described later is shortened. As a result, a filling time is shortened.

The Marangoni effect is a free surface movement phenomenon resulting from a local difference in surface tension between liquids (N. Imaishi/Int. J. Microgravity Sci. No. 31 Supplement 2014 (S5-S12)). The difference in surface tension serves as a driving force to cause such diffusion that a liquid having a low surface tension covers a wider surface. In other words, when the curable composition (A1) having a high surface tension is applied to the entire surface of the substrate and the curable composition (A2) having a low surface tension is dispensed dropwise, the prespread of the curable composition (A2) is accelerated.

<Contact Angle of Curable Composition>

With regard to the contact angle of each of the curable compositions (A1) and (A2) according to this embodiment, the contact angle of a composition of the components of the curable compositions (A1) and (A2) except the component (d) serving as a solvent is preferably 0° or more and 90° or less with respect to each of both the surface of the substrate and the surface of the mold. When the contact angle is more than 90°, a capillary force acts in a negative direction (direction in which a contact interface between the mold and the curable composition is shrunk) in a mold pattern or in a gap between the substrate and the mold, and hence the composition is not filled. The contact angle is particularly preferably 0° or more and 30° or less. As the contact angle becomes lower, a stronger capillary force acts and hence a filling rate increases (S. Reddy, R. T. Bonnecaze/Microelectronic Engineering, 82 (2005) 60-70).

The viscosity, the surface tension, and the contact angle of each of the curable compositions (A1) and (A2) according to this embodiment can be changed by addition of the component (d) serving as a solvent. However, the component (d) serving as a solvent may prevent curing of the curable compositions (A1) and (A2). Accordingly, the viscosity, the surface tension, and the contact angle of the compositions of the components of the curable compositions (A1) and (A2) except the component (d) serving as a solvent are used in this embodiment.

<Impurities Mixed in Curable Composition>

It is preferred that the curable compositions (A1) and (A2) according to this embodiment each be free of impurities to the extent possible. The term "impurities" as used herein refers to components except the component (a), the component (b), the component (c), and the component (d) described above.

Thus, it is preferred that the curable compositions according to this embodiment each be obtained through a purification step. The purification step is preferably filtration using a filter or the like.

When the filtration using a filter is performed, specifically, it is preferred that the component (a) and the component (b) described in the foregoing and additive components to be added as required be mixed, and then the mixture be filtered with a filter having a pore diameter of, for example, 0.001 μm or more and 5.0 μm or less. It is more preferred that the filtration using a filter be performed in a plurality of stages or be repeated a plurality of times. In addition, the filtered liquid may be filtered again. A plurality of filters having different pore diameters may be used to perform the filtration. A filter made of, for example, a polyethylene resin, a polypropylene resin, a fluororesin, or a nylon resin can be used as the filter to be used in the filtration. However, the filter is not particularly limited thereto.

Impurities such as particles, which are mixed in the curable compositions, can be removed through such purification step. Thus, the impurities such as the particles, can be prevented from forming unexpected unevenness in the cured film to be obtained after the curable compositions are cured to cause a pattern defect.

When the curable compositions according to this embodiment are used for the manufacture of a semiconductor integrated circuit, it is preferred to avoid the mixing of metal atom-containing impurities (metal impurities) in the curable compositions to the extent possible in order to prevent the operation of a product from being inhibited. In this case, the concentration of the metal impurities in the curable compositions is preferably 10 ppm or less, more preferably 100 ppb or less.

[Pattern Forming Method]

Next, a pattern forming method according to this embodiment is described with reference to the schematic sectional views of FIGS. 2A through 2H.

The pattern forming method according to this embodiment is one mode of the photo-nanoimprint method. The pattern forming method of this embodiment includes:

the first laying step (1) of laying the curable composition (A1) 202 of this embodiment described in the foregoing on the substrate 201;

the second laying step (2) of laying the curable composition (A2) 203 on the layer of the curable composition (A1) 202;

the mold contacting step (3) of sandwiching the mixture layer 206 obtained by partially mixing the curable composition (A1) 202 and the curable composition (A2) 203 between the mold 205 having a pattern and the substrate 201;

the light irradiating step (4) of irradiating the mixture layer 206 obtained by partially mixing the two kinds of curable compositions with the irradiation light 207 from the side of the mold 205 to cure the layer in one stroke; and the releasing step (5) of releasing the mold 205 from the cured film 208 formed of the curable compositions after the curing.

A cured film obtained by the method of producing a cured film having a pattern shape according to this embodiment is preferably a film having a pattern having a size of 1 nm or more and 10 mm or less. In addition, the cured film is more preferably a film having a pattern having a size of 10 nm or more and 100 μm or less. In general, a pattern forming technology for producing a film having a pattern (uneven structure) of a nanosize (1 nm or more and 100 nm or less) through the use of light is called a photo-nanoimprint method. The pattern forming method according to this embodiment uses the photo-nanoimprint method.

Each step is hereinafter described.

<First Laying Step (1)>

Figures 2A, 2B, 2C, 2D, 2E, 2F, 2G, 2H:
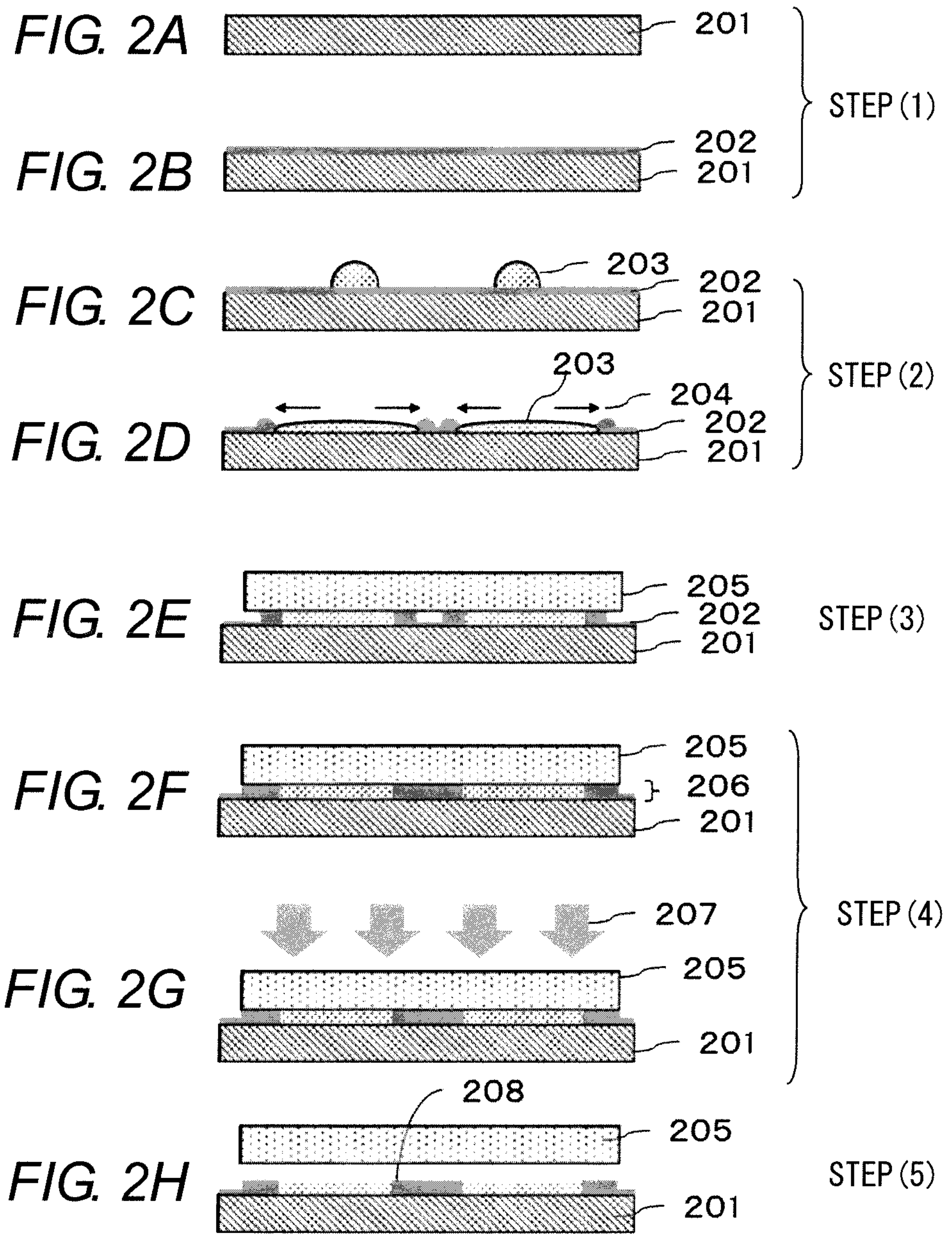
FIGS. 2A, 2B, 2C, 2D, 2E, 2F, 2G and 2H are schematic sectional views for illustrating a SST-NIL technology.
Figures 3A, 3B, 3C, 3D:
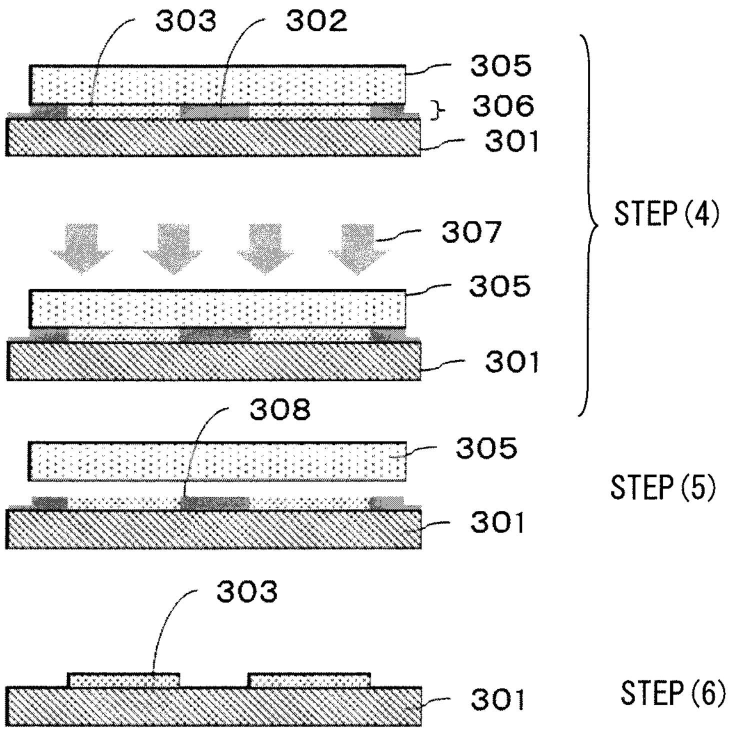
FIGS. 3A, 3B, 3C, and 3D are schematic sectional views for illustrating a problem to be solved by the invention.

In this step (first laying step), as illustrated in FIGS. 2A and 2B, the curable composition (A1) 202 according to this embodiment described in the foregoing is laid (applied) onto the substrate 201 to form an applied film.

The substrate 201 on which the curable composition (A1) 202 is to be arranged is a substrate to be processed, and a silicon wafer is typically used. A layer to be processed may be formed on the substrate 201. Another layer may be further formed between the substrate 201 and the layer to be processed. In addition, when a quartz substrate is used as the substrate 201, a replica of a quartz imprint mold (mold replica) can be produced.

In the present invention, however, the substrate 201 is not limited to the silicon wafer and the quartz substrate. The substrate 201 can be arbitrarily selected from substrates known as substrates for semiconductor devices such as aluminum, a titanium-tungsten alloy, an aluminum-silicon alloy, an aluminum-copper-silicon alloy, silicon oxide, and silicon nitride.

The adhesiveness of the surface of the substrate 201 (substrate to be processed) to be used or of the layer to be processed with each of the curable compositions (A1) 202 and (A2) 203 may be improved by a surface treatment such as a silane coupling treatment, a silazane treatment, or the formation of an organic thin film.

In this embodiment, as a method of arranging the curable composition (A1) 202 on the substrate 201 or the layer to be processed, there may be used, for example, an ink jet method, a dip coating method, an air knife coating method, a curtain coating method, a wire bar coating method, a gravure coating method, an extrusion coating method, a spin coating method, or a slit scan method. In the present invention, a spin coating method is particularly preferred. When the curable composition (A1) 202 is arranged on the substrate 201 or the layer to be processed by using the spin coating method, the component (d1) serving as a solvent may be volatilized by performing a baking step as required.

The average thickness of the film of the curable composition (A1) 202, which varies depending on applications where the composition is used, is, for example, 0.1 nm or more and 10,000 nm or less, preferably 1 nm or more and 20 nm or less, particularly preferably 1 nm or more and 10 nm or less.

<Second Laying Step (2)>

In this step (second laying step), as illustrated in FIGS. 2C and 2D, droplets of the curable composition (A2) 203 are preferably dispensed dropwise discretely and arranged on the layer of the curable composition (A1) 202. The inkjet method is particularly preferred as a method for the arrangement. The droplets of the curable composition (A2) 203 are densely arranged on a substrate 201 facing a region where groove portions are densely present on the mold 205, and are sparsely arranged on a substrate 201 facing a region where groove portions are sparsely present. Thus, the thickness of a remaining film 108 (see FIG. 1FA) to be described later can be controlled to a uniform value irrespective of the density of a pattern on the mold 205. In addition, the droplets of the curable composition (A2) 203 are arranged under an atmosphere containing a condensable gas (hereinafter referred to as "condensable gas atmosphere"). When the droplets of the curable composition (A2) 203 are arranged under the condensable gas atmosphere, the condensable gas dissolve in the droplets of the curable composition (A2) 203, hence the viscosity of the droplets become low and the droplets spread wider. The other aspect of the condensable gas is explained in the Mold Contacting Step.

In the present invention, the droplets of the curable composition (A2) 203 arranged in this step (second laying step) are quickly spread by the Marangoni effect using a difference in surface tension as a driving force as described in the foregoing (prespread) (FIGS. 2C and 2D). The inventors of the present invention have found that in the course of the prespread, the curable composition (A1) 202 and the curable composition (A2) 203 partially mix with each other, and that the extent to which the component (a1) serving as a polymerizable compound in the curable composition (A1) 202 and the curable composition (A2) 203 mix with each other affects the homogeneity of a cured product. In addition, the extent of the mixing affects the homogeneity of the cured product, e.g., the uniformity of its mechanical strength, photocurability, or etching resistance.

As described in the foregoing, in the present invention, the Distance in Hansen space Ra((a1)–(A2)) between the component (a1) serving as a polymerizable compound in the curable composition (A1) 202 and the curable composition (A2) 203 is 6 or less, and the Distance in Hansen space Ra((a1)–(b2)) between the component (b2) serving as a photopolymerization initiator in the curable composition (A2) 203 and the component (a1) serving as a polymerizable compound in the curable composition (A1) 202 is smaller than the Distance in Hansen space Ra((a2)–(b2)) between the component (b2) serving as a photopolymerization initiator in the curable composition (A2) 203 and the component (a2) serving as a polymerizable compound in the curable composition (A2) 203.

Accordingly, the mixing of the curable composition (A1) 202 and the curable composition (A2) 203 quickly and uniformly progresses, and hence the homogeneity of the cured product, e.g., the uniformity of its mechanical strength, photocurability, or etching resistance is obtained.

<Mold Contacting Step (3)>

Next, as illustrated in FIG. 2E, the mold 205 having a template pattern for transferring a pattern shape is brought into contact with a layer of a liquid obtained by partially mixing the curable composition (A1) 202 and the curable composition (A2) 203, the liquid being formed in the previous steps (first and second laying steps). Thus, a groove portion of a fine pattern on the surface of the mold 205 is filled with the liquid obtained by partially mixing the curable composition (A1) 202 and the curable composition (A2) 203, and hence a liquid film filled into the fine pattern of the mold 205 is obtained.

The mold 205 that is formed of an optically transparent material is desirably used as the mold 205 considering the next step (light irradiating step). Preferred specific examples of the material for forming the mold 205 include: glass, quartz, an optically transparent resin such as PMMA or a polycarbonate resin, a transparent metal-deposited film, a flexible film made of polydimethylsiloxane or the like, a photocured film, and a metal film. In the case of using the optically transparent resin as the material for forming the mold 205, it is necessary to select a resin that does not dissolve in a component contained in the curable composition. Quartz is particularly preferred as the material for forming the mold 205 because of its small thermal expansion coefficient and small pattern deformation.

The fine pattern on the surface of the mold 205 preferably has a pattern height of 4 nm or more and 200 nm or less.

As the pattern height becomes lower, the force by which the mold 205 is peeled from the photocured film of a resist in the releasing step, i.e., a release force reduces, and the number of release defects remaining on a mask side owing to the tearing-off of a resist pattern in association with the release reduces. Adjacent resist patterns are brought into contact with each other by the elastic deformation of the resist patterns due to an impact at the time of the peeling of the mold 205, and hence the resist patterns adhere to each other or are damaged in some cases. However, when the pattern height is about twice or less as large as a pattern width (an aspect ratio is 2 or less), there is a high possibility that such inconveniences can be avoided. Meanwhile, when the pattern height is excessively low, the processing accuracy of the substrate 201 (substrate to be processed) is low.

The mold 205 may be subjected to a surface treatment before this step, which is a mold contacting step of the curable compositions (A1) 202 and (A2) 203 and the mold 205, so as to enhance the releasability between the curable compositions (A1) 202 and (A2) 203 and the surface of the mold 205. As a method for the surface treatment, there is given a method involving forming a release agent layer by applying a release agent onto the surface of the mold 205. In this case, examples of the release agent to be applied onto the surface of the mold 205 include a silicon-based release agent, a fluorine-based release agent, a hydrocarbon-based release agent, a polyethylene-based release agent, a polypropylene-based release agent, a paraffin-based release agent, a montan-based release agent, and a carnauba-based release agent. For example, a commercially available application-type release agent such as OPTOOL (trademark) DSX manufactured by Daikin Industries, Ltd. can be suitably used. One kind of the release agents may be used alone, or two or more kinds thereof may be used in combination. Of those, fluorine-based and hydrocarbon-based release agents are particularly preferred.

A pressure to be applied to the curable compositions (A1) 202 and (A2) 203 when the mold 205 and the curable compositions (A1) 202 and (A2) 203 are brought into contact with each other in this step (mold contacting step) as illustrated in FIG. 2E is not particularly limited. The pressure is desirably set to 0 MPa or more and 100 MPa or less. In addition, the pressure is preferably 0 MPa or more and 50 MPa or less, more preferably 0 MPa or more and 30 MPa or less, still more preferably 0 MPa or more and 20 MPa or less.

In the present invention, the prespread of the droplets of the curable composition (A2) 203 has progressed in the previous step (second laying step), and hence the spread of the curable composition (A2) 203 in this step is quickly completed. In a boundary region between the droplets of the curable composition (A2) 203, the spread is finally completed and the concentration of the curable composition (A1) 202 is high. However, as described in the foregoing, the contact angle of the curable composition (A1) 202 is low and hence the fill is quickly completed in the region as well.

As described above, the spread and fill of the curable compositions (A1) 202 and (A2) 203 are quickly completed in this step, and hence the time period for which the mold 205, and the curable compositions (A1) 202 and (A2) 203 are brought into contact with each other can be set to be short. In other words, one of the effects of the present invention is as follows: many pattern forming steps can be completed within a short time period, and hence high productivity is obtained. The time period for which the mold 205 and the compositions are brought into contact with each other, which is not particularly limited, is desirably set to, for example, 0.1 second or more and 600 seconds or less. In addition, the time period is preferably 0.1 second or more and 3 seconds or less, particularly preferably 0.1 second or more and 1 second or less. When the time period is shorter than 0.1 second, the following tendency is observed: the spread and the fill become insufficient, and hence many defects called nonfill defects occur.

This step can be performed under any condition of an air atmosphere, a reduced pressure atmosphere, and an inert gas atmosphere. Of those atmospheres, a reduced pressure atmosphere or an inert gas atmosphere is preferred because an influence of oxygen or moisture on a curing reaction can be prevented. When this step is performed under an inert gas atmosphere, specific examples of the inert gas that can be used include nitrogen, carbon dioxide, helium, argon, various fluorocarbon gases, and a mixed gas thereof. A preferred pressure when this step is performed under a particular gas atmosphere including an air atmosphere is 0.0001 atm or more and 10 atm or less.

The mold contacting step may be performed under an atmosphere containing a condensable gas. The term "condensable gas" as used herein refers to the following gas: when the gas in the atmosphere is filled into a groove portion of the fine pattern formed on the mold 205, and the gap between the mold 205 and the substrate 201 together with the curable compositions (A1) 202 and (A2) 203, the gas is condensed by a capillary pressure generated at the time of the filling to liquefy. The condensable gas is present as a gas in the atmosphere before the curable compositions (A1) 202 and (A2) 203, and the mold 205 are brought into contact with each other in the mold contacting step (see FIGS. 1D and 1DA).

When the mold contacting step is performed under the condensable gas atmosphere, the gas filled into a groove portion of the fine pattern is liquefied by a capillary pressure generated by the curable compositions (A1) 202 and (A2) 203, and hence air bubbles disappear. Accordingly, a filling property becomes excellent. The condensable gas may dissolve in the curable composition (A1) 202 and/or the curable composition (A2) 203.

The boiling point of the condensable gas, which is not limited as long as the boiling point is equal to or less than the ambient temperature of the mold contacting step, is preferably from −10° C. to 23° C., more preferably from 10° C. to 23° C. When the boiling point falls within the range, the filling property is more excellent.

The vapor pressure of the condensable gas at the ambient temperature in the mold contacting step, which is not limited as long as the vapor pressure is equal to or less than a pressure to be applied to the curable compositions (A1) 202 and (A2) 203 when the mold 205 and the curable compositions (A1) 202 and (A2) 203 are brought into contact with each other when impression is performed in the mold contacting step, is preferably from 0.1 MPa to 0.4 MPa. When the vapor pressure falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: decompression is needed and hence an apparatus becomes complicated.

The ambient temperature in the mold contacting step, which is not particularly limited, is preferably from 20° C. to 25° C.

Specific examples of the condensable gas include fluorocarbons such as: a chlorofluorocarbon (CFC) such as trichlorofluoromethane; a fluorocarbon (FC); a hydrochlorofluorocarbon (HCFC); a hydrofluorocarbon (HFC) such as 1,1,1,3,3-pentafluoropropane ($CHF_2CH_2CF_3$, HFC-245fa, PFP); and a hydrofluoroether (HFE) such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contacting step is from 20° C. to 25° C., the filling property is excellent. Further, 1,1,1,3,3-pentafluoropropane is particularly preferred from the viewpoint of being excellent in safety.

One kind of the condensable gases may be used alone, or two or more kinds thereof may be used as a mixture. In addition, any such condensable gas may be mixed with a non-condensable gas such as air, nitrogen, carbon dioxide, helium, or argon, before use. The non-condensable gas with which the condensable gas is mixed is preferably helium from the viewpoint of the filling property. Helium can permeate the mold 205. Accordingly, when the gases (the condensable gas and helium) in the atmosphere are filled into a groove portion of the fine pattern formed on the mold 205 in the mold contacting step together with the curable composition (A1) 202 and/or the curable composition (A2) 203, the condensable gas liquefies and helium permeates the mold 205.

<Light Irradiating Step (4)>

Next, as illustrated in FIGS. 2F and 2G, a mixture layer 206 obtained by partially mixing the curable composition (A1) 202 and the curable composition (A2) 203 is irradiated with irradiation light 207 through the mold 205. In more detail, the curable composition (A1) 202 and/or the curable composition (A2) 203 filled into the fine pattern of the mold 205 are/is irradiated with the irradiation light 207 through the mold 205. Thus, the curable composition (A1) 202 and/or the curable composition (A2) 203 filled into the fine pattern of the mold 205 are/is cured by the irradiation light 207 to become the cured film 208 having a pattern shape.

In this case, the irradiation light 207 with which the curable composition (A1) 202 and/or the curable composition (A2) 203 filled into the fine pattern of the mold 205 are/is irradiated is selected depending on the sensitive wavelengths of the curable compositions (A1) 202 and (A2) 203. Specifically, it is preferred that UV light having a wavelength of 150 nm or more and 400 nm or less, an X-ray, an electron beam, or the like be appropriately selected and used.

Of those, the irradiation light 207 is particularly preferably UV light. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. In addition, the number of the light sources to be used may be one or two or more. Further, the entire surface of the curable composition (A1) 202 and/or the curable composition (A2) 203 filled into the fine pattern of the mold 205 may be irradiated with light, or a part of the surface thereof may be irradiated with light.

In addition, the light irradiation may be performed on an entire region on the substrate 201 intermittently a plurality of times, or may be continuously performed on the entire region. Further, the following may be performed: a partial region A is irradiated with the light in a first irradiating process, and a region B different from the region A is irradiated with the light in a second irradiating process.

In the light irradiating step (4), as described in the foregoing, leaking light, in other words, the diffusion of the light to the outside of the shot region is inevitable in terms of restrictions on costs for the mold 205 and an apparatus. In the present invention, it is preferred that the curable composition (A1) 202 be substantially free of photoreactivity. When the blending ratio of the component (b) in the curable composition (A1) 202 is set to less than 0.1 wt % with respect to the total of the component (a), the component (b), and the component (c), the curable composition (A1) 202 is substantially free of photoreactivity, and hence a problem in that the curable composition (A1) 202 laid outside the shot region is photocured by the irradiation light 207 leaking to the outside of the shot region can be prevented.

<Releasing Step (5)>

Next, the cured film 208 having a pattern shape and the mold 205 are released from each other. In this step (releasing step), as illustrated in FIG. 2H, the cured film 208 having a pattern shape and the mold 205 are released from each other, and hence the cured film 208 having a pattern shape serving as the reverse pattern of the fine pattern formed on the mold 205, the film being formed in the step (4) (light irradiating step), is obtained in an independent state. A cured film remains in a groove portion of the grove/land pattern of the cured film 208 having a pattern shape, and the film is called a remaining film 108 (see FIG. 1FA).

When the mold contacting step is performed under the condensable gas atmosphere, the condensable gas vaporizes in association with a reduction in pressure of the interface at which the cured film 208 and the mold 205 are in contact with each other at the time of the release of the cured film 208 and the mold 205 in the releasing step. Thus, a reducing effect on the release force serving as a force needed for releasing the cured film 208 and the mold 205 from each other tends to be exhibited.

A method of releasing the cured film 208 having a pattern shape and the mold 205 from each other is not particularly limited as long as part of the cured film 208 having a pattern shape is not physically damaged at the time of the release, and various conditions and the like are also not particularly limited. For example, the following may be performed: the substrate 201 (substrate to be processed) is fixed and the mold 205 is peeled by being moved so as to recede from the substrate 201. Alternatively, the following may be performed: the mold 205 is fixed and the substrate 201 is peeled by being moved so as to recede from the mold 205. Alternatively, both the substrate 201 and the mold 205 may be peeled from each other by being pulled in directions diametrically opposite to each other.

A cured film 208 having a desired groove/land pattern shape (pattern shape associated with the groove/land shape of the mold 205) at a desired position can be obtained by a series of steps (production process) including the step (1) to the step (5]).

The method of producing a film having a pattern shape of this embodiment enables the following: the curable composition (A1) 202 is collectively laid on most of the surface of the substrate 201 in the step (1), and a repeating unit (shot) including the step (2) to the step (5) is repeatedly performed on the same substrate a plurality of times. In addition, the step (1) to the step (5) may be repeatedly performed on the same substrate a plurality of times. When the repeating unit (shot) including the step (1) to the step (5) or of the step (2) to the step (5) is repeated a plurality of times, a cured film 208 having a plurality of desired groove/land pattern shapes (pattern shapes associated with the groove/land shape of the mold 205) at desired positions of the substrate 201 (substrate to be processed) can be obtained.

The substrate 201 (substrate to be processed) or the layer to be processed on the substrate 201 (substrate to be processed) can be processed into a pattern shape by using: the cured film 208 having a pattern shape obtained through the step (1) to the step (5), the film serving as a mask; and a processing method such as etching. As a result, a processed substrate can be obtained. In addition, after the layer to be processed has been further formed on the cured film 208 having a pattern shape, pattern transfer may be performed by using a processing method such as etching. Thus, a circuit structure based on the pattern shape of the cured film 208 having the pattern shape can be formed on the substrate 201. Thus, a circuit board to be utilized in a semiconductor element or the like can be produced. In addition, an electronic instrument such as a display, a camera, or a medical apparatus, can be formed by connecting the circuit board and, for example, a circuit control mechanism for a circuit board. Examples of the semiconductor element as used herein include a LSI, a system LSI, a DRAM, a SDRAM, a RDRAM, a D-RDRAM, and a NAND flash.

An optical component can also be obtained by utilizing the cured film 208 having a pattern shape obtained through the step (1) to the step (5) as an optical member such as a diffraction grating or a polarizing plate (the case where the film is used as one member of the optical member is included). In such case, an optical component having at least the substrate 201 and the cured film 208 having a pattern shape on the substrate 201 can be obtained.

In addition, a quartz replica of a quartz imprint mold (mold replica) can be produced by: producing the cured film 208 having a pattern shape through the use of a quartz substrate as the substrate 201 and through the step (1) to the step (5); and performing pattern transfer through the use of a processing method such as etching.

[Set of Imprint Pretreatment Coating Material (Curable Composition (A1)) and Imprint Resist (Curable Composition (A2))]

Another aspect of the present invention described above is to provide an imprint pretreatment coating material which forms a liquid film as pretreatment coating on a substrate and promotes spreading of components of liquid droplets in the plane of the substrate when the liquid droplets are dispensed onto the liquid film.

In other words, the present invention includes the imprint pretreatment coating material consisting of a curable composition (A1), which forms a liquid film as pretreatment coating on a substrate and promotes spreading of components of liquid droplets of imprint resist consisting of a curable composition (A2) in the plane of the substrate when the liquid droplets are dispensed onto the liquid film, wherein a Distance in Hansen space Ra((a1)−(A2)) between the component (a1) serving as a polymerizable compound in the imprint pretreatment coating material and the curable composition (A2) in the liquid droplets to be dispensed being 6 or less.

It is preferred that the surface tension of the imprint pretreatment coating material be higher than the surface tension of the liquid droplets dispensed onto the liquid film.

Particularly, it is more preferred that the surface tension of a composition of the components of the imprint pretreatment coating material except the solvent be higher than the surface tension of a composition of the components the imprint resist except the solvent.

Due to the above property, when the liquid droplets are dispensed on the liquid film as pretreatment coating on the substrate, spreading of the components of the liquid droplets in the plane of the substrate is promoted to thereby realize favorable imprint.

Preferably, such the imprint pretreatment coating material is provided as a set with the imprint resist.

That is, such a set fulfills the relation that the surface tension of the composition of the components of the imprint pretreatment coating material except the solvent is higher than the surface tension of the composition of the components of the imprint resist except the solvent is provided for realizing favorable imprint.

Particularly, it is more preferable that the set fulfills the relation that the difference between surface tension of the composition of the components of the imprint pretreatment coating material except the solvent and the surface tension of the composition of the components of the imprint resist except the solvent is 1 mN/m or more and 25 mN/m or less.

A further aspect of the present invention is to provide a method of pretreating a substrate for favorable imprint, the method comprising coating the substrate with the imprint pretreatment coating material.

In addition, the present invention further includes a method for forming a pattern on a substrate. In the pattern forming method of the present invention, a resist is dispensed dropwise discretely onto a substrate coated with the imprint pretreatment coating material to thereby promote spreading of components of the resist in the plane of the substrate, whereby the time required for imprint processing can be reduced.

EXAMPLES

The present invention is hereinafter described in more detail by way of Examples, but the technical scope of the present invention is not limited to Examples to be described below. The terms "part(s)" and "%" to be used below are by weight in all cases unless otherwise stated.

Example 1

(1) Preparation of Curable Composition (A1-1)

A component (a1), a component (b1), a component (c1), and a component (d1) described below were blended, and the blend was filtered with a 0.2-micrometer filter made of ultrahigh-molecular weight polyethylene to prepare a curable composition (A1-1) of Example 1.

| | |
|---|---|
| (1-1) Component (a1): | 100 parts by weight in total |
| m-Xylylene diacrylate (manufactured by NARD, abbreviation: mXDA): | 100 parts by weight |
| (1-2) Component (b1): | 0 parts by weight in total |

The component (b1) was not added.

| | |
|---|---|
| (1-3) Component (c1): | 0 parts by weight in total |

The component (c1) was not added.

| | |
|---|---|
| (1-4) Component (d1): | 33,000 parts by weight in total |
| Propylene glycol monomethyl ether acetate (manufactured by Tokyo Chemical Industry Co., Ltd., abbreviation: PGMEA): | 33,000 parts by weight |

-continued (2) Measurement of Surface Tension of Curable Composition (A1-1)

The surface tension of a composition of the components of the curable composition (A1-1) except the component (d1) serving as a solvent at 25° C. was measured with an automatic surface tension meter DY-300 (manufactured by Kyowa Interface Science Co., Ltd.) by a plate method involving using a platinum plate. As a result, the surface tension was 39.3 mN/m. The measurement was performed under the conditions of a number of times of the measurement of 5 and a prewet immersion distance of the platinum plate of 0.35 mm. The first measured value was excluded, and the average of the second to fifth measured values was defined as the surface tension.

(3) Preparation of Curable Composition (A2-1)

A component (a2), a component (b2), a component (c2), and a component (d2) described below were blended, and the blend was filtered with a 0.2-micrometer filter made of ultrahigh-molecular weight polyethylene to prepare a curable composition (A2-1) of Example 1.

| | |
|---|---|
| (3-1) Component (a2): | 94 parts by weight in total |
| Isobornyl acrylate (manufactured by Kyoeisha Chemical Co., Ltd., trade name: IB-XA), specific gravity: 0.993: | 9 parts by weight |
| Benzyl acrylate (manufactured by Osaka Organic Chemical Industry Ltd., trade name: V#160), specific gravity: 1.06: | 38 parts by weight |
| Neopentyl glycol diacrylate (manufactured by Kyoeisha Chemical Co., Ltd., trade name: NP-A), specific gravity: 0.998: | 47 parts by weight |
| (3-2) Component (b2): | 3 parts by weight in total |
| Irgacure 369 (manufactured by BASF, abbreviation: I.369): | 3 parts by weight |
| (3-3) Component (c2): | 0 parts by weight in total |

The component (c2) was not added.

| | |
|---|---|
| (3-4) Component (d2): | 0 parts by weight in total |

The component (d2) was not added.

(4) Measurement of Surface Tension of Curable Composition (A2-1)

The surface tension of the curable composition (A2-1) was measured by the same method as that of the curable composition (A1-1). As a result, the surface tension was 33.4 mN/m.

(5) Calculation of Solubility Parameter

The Hansen solubility parameters of the component (a1) in the curable composition (A1-1), the curable composition (A2-1), and the components (a2) and (b2) in the curable composition (A2) were calculated with the calculation software HSPiP. The Hansen solubility parameter of the component (a2) was determined by calculating a volume ratio from the specific gravity of each acrylate and the mixed parts by weight thereof. The results of the calculation are shown in Table 3 to Table 5.

The Ra((a1)–(A2-1)) represented by the formula (1) was calculated by using those values. As a result, the Ra((a1)–

(A2-1)) was 2.2, and hence it was expected that sufficient mixing of the component (a1) and the curable composition (A2-1) was obtained.

Next, the formula (2) minus the formula (3), i.e., Ra((a2)−(b2))−Ra((a1)−(b2)) was calculated. As a result, the Ra((a2)−(b2))−Ra((a1)−(b2)) was 1.6. The foregoing satisfies the relationship represented by the formula (4). It was expected that the component (b2) had such a property as to easily dissolve in the component (a1), and hence the components quickly mixed with each other.

(6) Photo-Nanoimprint Process

A film of the curable composition (A1-1) having a thickness of from about 5 nm to about 10 nm can be obtained by applying the curable composition (A1-1) onto a silicon substrate with a spin coater.

One-picoliter droplets of the curable composition (A2-1) can be arranged discretely on the film of the curable composition (A1-1) by using an inkjet method. A droplet amount is set to, for example, such an amount that the average thickness of a cured film becomes about 50 nm. At this time, the surface tension of the curable composition (A1-1) arranged in the lower layer is higher than the surface tension of the curable composition (A2-1) dispensed dropwise in the upper layer, and hence the Marangoni effect is expressed and the expansion (prespread) of the droplets of the curable composition (A2-1) is quick.

In the second laying step and the mold contacting step, the curable composition (A1-1) and the curable composition (A2-1) mix with each other, and the photopolymerization initiator component (b2) migrates from the curable composition (A2-1) to the curable composition (A1-1). Accordingly, the curable composition (A1-1) obtains photopolymerizability. And then, in the light irradiating step, the mixture of the curable composition (A1-1) and the curable composition (A2-1) satisfactorily cures.

(7) Etching Process

The uniformity of an in-plane distribution can be confirmed by subjecting the cured film to dry etching with a dry etching apparatus.

Example 2

(1) and (2) Curable Composition (A1-2)

The same composition as that of Example 1 was used as a curable composition (A1-2).

(3) Preparation of Curable Composition (A2-2)

A component (a2), a component (b2), a component (c2), and a component (d2) described below were blended, and the blend was filtered with a 0.2-micrometer filter made of ultrahigh-molecular weight polyethylene to prepare a curable composition (A2-2) of Example 2.

| | |
|---|---|
| (3-1) Component (a2): | 94 parts by weight in total |

The same formulation as that of Example 1 was adopted.

| | |
|---|---|
| (3-2) Component (b2): | 3 parts by weight in total |
| Irgacure TPO-L (manufactured by BASF, abbreviation: ITPL-0): | 3 parts by weight |
| (3-3) Component (c2): | 0 parts by weight in total |

The component (c2) was not added in the same manner as in Example 1.

| | |
|---|---|
| (3-4) Component (d2): | 0 parts by weight in total |

The component (d2) was not added in the same manner as in Example 1.

(4) Measurement of Surface Tension of Curable Composition (A2-2)

The surface tension of the curable composition (A2-2) was measured in the same manner as in Example 1. As a result, the surface tension was 33.4 mN/m.

(5) Calculation of Solubility Parameter

The Hansen solubility parameters of the component a1 in the curable composition (A1-2), the curable composition (A2-2), and the components (a2) and (b2) in the curable composition (A2-2) were calculated with the calculation software HSPiP in the same manner as in Example 1. The results of the calculation are shown in Table 3 to Table 5.

The Ra((a1)−(A2-2)) represented by the formula (1) was calculated by using those values. As a result, the Ra((a1)−(A2-2)) was 2.2, and hence it was expected that sufficient mixing of the component (a1) and the curable composition (A2-2) was obtained.

Next, the formula (2) minus the formula (3), i.e., Ra((a2)−(b2))−Ra((a1)−(b2)) was calculated. As a result, the Ra((a2)−(b2))−Ra((a1)−(b2)) was 1.8. The foregoing satisfies the relationship represented by the formula (4). It was expected that the component (b2) had such a property as to easily dissolve in the component (a1), and hence the components quickly mixed with each other.

(6) Photo-Nanoimprint Process

As in Example 1, the surface tension of the curable composition (A1-2) arranged in the lower layer is higher than the surface tension of the curable composition (A2-2) dispensed dropwise in the upper layer, and hence the Marangoni effect is expressed and the expansion (prespread) of the droplets of the curable composition (A2-2) is quick.

As in Example 1, in the light irradiating step, the mixture of the curable composition (A1-2) and the curable composition (A2-2) satisfactorily cures.

(7) Etching Process

The uniformity of an in-plane distribution can be confirmed by subjecting the cured film to dry etching with a dry etching apparatus.

Example 3

(1) Curable Composition (A1-3)

A curable composition A1-3 was obtained in the same manner as in Example 1 except that the following material was used as the component (a1).

| | |
|---|---|
| Component (a1): | 100 parts by weight in total |
| Trimethylolpropane triacrylate (manufactured by Sigma-Aldrich, abbreviation: TMPTA): | 100 parts by weight |

(2) Measurement of Surface Tension of Curable Composition (A1-3)

The surface tension of a composition of the components of the curable composition (A1-3) except the component (d1) serving as a solvent was measured in the same manner as in Example 1. As a result, the surface tension was 36.4 mN/m.

(3) Preparation of Curable Composition (A2-3)

A component (a2), a component (b2), a component (c2), and a component (d2) described below were blended, and the blend was filtered with a 0.2-micrometer filter made of ultrahigh-molecular weight polyethylene to prepare a curable composition (A2-3) of Example 3.

| | |
|---|---|
| (3-1) Component (a2): | 94 parts by weight in total |

The same formulation as that of Example 1 was adopted.

| | |
|---|---|
| (3-2) Component (b2): | 3 parts by weight in total |
| Irgacure 1173 (manufactured by BASF, abbreviation: I.1173): | 3 parts by weight |
| (3-3) Component (c2): | 0 parts by weight in total |

The component (c2) was not added in the same manner as in Example 1.

| | |
|---|---|
| (3-4) Component (d2): | 0 parts by weight in total |

The component (d2) was not added in the same manner as in Example 1.

(4) Measurement of Surface Tension of Curable Composition (A2-3)

The surface tension of the curable composition (A2-3) was measured in the same manner as in Example 1. As a result, the surface tension was 33.4 mN/m.

(5) Calculation of Solubility Parameter

The Hansen solubility parameters of the component (a1) in the curable composition (A1-3), the curable composition (A2-3), and the components (a2) and (b2) in the curable composition (A2-3) were calculated with the calculation software HSPiP in the same manner as in Example 1. The results of the calculation are shown in Table 3 to Table 5.

The Ra((a1)-(A2-3)) represented by the formula (1) was calculated by using those values. As a result, the Ra((a1)-(A2-3)) was 1.1, and hence it was expected that sufficient mixing of the component (a1) and the curable composition (A2-3) was obtained.

Next, the formula (2) minus the formula (3), i.e., Ra((a2)-(b2))-Ra((a1)-(b2)) was calculated. As a result, the Ra((a2)-(b2))-Ra((a1)-(b2)) was 0.2. The foregoing satisfies the relationship represented by the formula (4). It was expected that the component (b2) had such a property as to easily dissolve in the component (a1), and hence the components quickly mixed with each other.

(6) Photo-Nanoimprint Process

As in Example 1, the surface tension of the curable composition (A1-3) arranged in the lower layer is higher than the surface tension of the curable composition (A2-3) dispensed dropwise in the upper layer, and hence the Marangoni effect is expressed and the expansion (prespread) of the droplets of the curable composition (A2-3) is quick.

As in Example 1, in the light irradiating step, the mixture of the curable composition (A1-3) and the curable composition (A2-3) satisfactorily cures.

(7) Etching Process

The uniformity of an in-plane distribution can be confirmed by subjecting the cured film to dry etching with a dry etching apparatus.

Example 4

(1) Curable Composition (A1-4)

A curable composition A1-4 was obtained in the same manner as in Example 1 except that the following material was used as the component (a1).

| | |
|---|---|
| Component (a1): | 100 parts by weight in total |
| Dimethyloltricyclodecane diacrylate (manufactured by Kyoeisha Chemical Co., Ltd., abbreviation: DCP-A): | 100 parts by weight |

(2) Measurement of Surface Tension of Curable Composition (A1-4)

The surface tension of a composition of the components of the curable composition (A1-4) except the component (d1) serving as a solvent was measured in the same manner as in Example 1. As a result, the surface tension was 38.6 mN/m.

(3) Preparation of Curable Composition (A2-4)

A component (a2), a component (b2), a component (c2), and a component (d2) described below were blended, and the blend was filtered with a 0.2-micrometer filter made of ultrahigh-molecular weight polyethylene to prepare a curable composition (A2-4) of Example 4.

| | |
|---|---|
| (3-1) Component (a2): | 94 parts by weight in total |

The same formulation as that of Example 1 was adopted.

| | |
|---|---|
| (3-2) Component (b2): | 3 parts by weight in total |
| 1,7-bis(9,9'-Heptamethylenediacridine) (manufactured by ADEKA CORPORATION, abbreviation: N.1717): | 3 parts by weight |
| (3-3) Component (c2): | 0 parts by weight in total |

The component (c2) was not added in the same manner as in Example 1.

| | |
|---|---|
| (3-4) Component (d2): | 0 parts by weight in total |

The component (d2) was not added in the same manner as in Example 1.

(4) Measurement of Surface Tension of Curable Composition (A2-4)

The surface tension of the curable composition (A2-4) was measured in the same manner as in Example 1. As a result, the surface tension was 33.4 mN/m.

(5) Calculation of Solubility Parameter

The Hansen solubility parameters of the component (a1) in the curable composition (A1-4), the curable composition (A2-4), and the components (a2) and (b2) in the curable composition (A2-4) were calculated with the calculation software HSPiP in the same manner as in Example 1. The results of the calculation are shown in Table 3 to Table 5.

The Ra((a1)-(A2-4)) represented by the formula (1) was calculated by using those values. As a result, the Ra((a1)-(A2-4)) was 1.4, and hence it was expected that sufficient mixing of the component (a1) and the curable composition (A2-4) was obtained.

Next, the formula (2) minus the formula (3), i.e., Ra((a2)-(b2))-Ra((a1)-(b2)) was calculated. As a result, the Ra((a2)−(b2))−Ra((a1)−(b2)) was 1.0. The foregoing satisfies the relationship represented by the formula (4). It was expected that the component (b2) had such a property as to easily dissolve in the component (a1), and hence the components quickly mixed with each other.

(6) Photo-Nanoimprint Process

As in Example 1, the surface tension of the curable composition (A1-4) arranged in the lower layer is higher than the surface tension of the curable composition (A2-4) dispensed dropwise in the upper layer, and hence the Marangoni effect is expressed and the expansion (prespread) of the droplets of the curable composition (A2-4) is quick.

As in Example 1, in the light irradiating step, the mixture of the curable composition (A1-4) and the curable composition (A2-4) satisfactorily cures.

(7) Etching Process

The uniformity of an in-plane distribution can be confirmed by subjecting the cured film to dry etching with a dry etching apparatus.

Example 5

(1) Curable Composition (A1-5)

A curable composition A1-5 was obtained in the same manner as in Example 1 except that the following material was used as the component (a1).

| | |
|---|---|
| Component (a1): | 100 parts by weight in total |
| Pentaerythritol triacrylate (manufactured by DKS Co. Ltd., abbreviation: PET-3): | 100 parts by weight |

(2) Measurement of Surface Tension of Curable Composition (A1-5)

The surface tension of a composition of the components of the curable composition (A1-5) except the component (d1) serving as a solvent was measured in the same manner as in Example 1. As a result, the surface tension was 39.6 mN/m.

(3) Preparation of Curable Composition (A2-5)

A component (a2), a component (b2), a component (c2), and a component (d2) described below were blended, and the blend was filtered with a 0.2-micrometer filter made of ultrahigh-molecular weight polyethylene to prepare a curable composition (A2-5) of Example 5.

(3-1) Component (a2):

94 parts by weight in total

The same formulation as that of Example 1 was adopted.

(3-2) Component (b2):

3 parts by weight in total

Irgacure 1173 (manufactured by BASF, abbreviation: 1.1173):

3 parts by weight (3-3) Component (c2):

0 parts by weight in total

The component (c2) was not added in the same manner as in Example 1.

(3-4) Component (d2):

0 parts by weight in total

The component (d2) was not added in the same manner as in Example 1.

(4) Measurement of Surface Tension of Curable Composition (A2-5)

The surface tension of the curable composition (A2-5) was measured in the same manner as in Example 1. As a result, the surface tension was 33.4 mN/m.

(5) Calculation of Solubility Parameter

The Hansen solubility parameters of the component (a1) in the curable composition (A1-5), the curable composition (A2-5), and the components (a2) and (b2) in the curable composition (A2-5) were calculated with the calculation software HSPiP in the same manner as in Example 1. The results of the calculation are shown in Table 3 to Table 5.

The Ra((a1)−(A2-5)) represented by the formula (1) was calculated by using those values. As a result, the Ra((a1)−(A2-5)) was 5.2, and hence it was expected that sufficient mixing of the component (a1) and the curable composition (A2-5) was obtained.

Next, the formula (2) minus the formula (3), i.e., Ra((a2)−(b2))−Ra((a1)−(b2)) was calculated. As a result, the Ra((a2)−(b2))−Ra((a1)−(b2)) was 1.7. The foregoing satisfies the relationship represented by the formula (4). It was expected that the component (b2) had such a property as to easily dissolve in the component (a1), and hence the components quickly mixed with each other.

(6) Photo-Nanoimprint Process

As in Example 1, the surface tension of the curable composition (A1-5) arranged in the lower layer is higher than the surface tension of the curable composition (A2-5) dispensed dropwise in the upper layer, and hence the Marangoni effect is expressed and the expansion (prespread) of the droplets of the curable composition (A2-5) is quick.

As in Example 1, in the light irradiating step, the mixture of the curable composition (A1-5) and the curable composition (A2-5) satisfactorily cures.

(7) Etching Process

The uniformity of an in-plane distribution can be confirmed by subjecting the cured film to dry etching with a dry etching apparatus.

Comparative Example 0

(1) and (2) Curable Composition (A1-0')

In Comparative Example 0, the curable composition (A1) was not used.

(3) and (4) Curable Composition (A2-0')

The same composition as that of Example 1 was used as a curable composition (A2-0').

(6) Photo-Nanoimprint Process

When the curable composition (A2-0') is directly dispensed dropwise onto the surface of a substrate serving as a solid surface, the Marangoni effect is not expressed. In other words, a prespread promoting effect is not obtained and hence the expansion of the droplets of the curable composition (A2-0') is slower than that of each of Examples of the present invention.

(7) Etching Process

The uniformity of an in-plane distribution can be confirmed by subjecting a cured film to dry etching with a dry etching apparatus.

Comparative Example 1

(1) Preparation of Curable Composition (A1-1')

A component (a1), a component (b1), a component (c1), and a component (d1) described below were blended, and the blend was filtered with a 0.2-micrometer filter made of ultrahigh-molecular weight polyethylene to prepare a curable composition (A1-1') of Comparative Example 1.

| | |
|---|---|
| (1-1) Component (a1): | 100 parts by weight in total |
| Acrylic acid (manufactured by Sigma-Aldrich): | 100 parts by weight |
| (1-2) Component (b1): | 0 parts by weight in total |

The component (b1) was not added.

| | |
|---|---|
| (1-3) Component (c1): | 0 parts by weight in total |

The component (c1) was not added.

| | |
|---|---|
| (1-4) Component (d1): | 33,000 parts by weight in total |
| Propylene glycol monomethyl ether acetate (manufactured by Tokyo Chemical Industry Co., Ltd., abbreviation: PGMEA): | 33,000 parts by weight |

(2) Measurement of Surface Tension of Curable Composition (A1-1')

The surface tension of a composition of the components of the curable composition (A1-1') except the component (d1) serving as a solvent was measured in the same manner as in Example 1. As a result, the surface tension was 69.9 mN/m.

(3) Preparation of Curable Composition (A2-1')

A curable composition (A2-1') was obtained in the same manner as in Example 1 except that the following material was used as the component (b2).

| | |
|---|---|
| (3-2) Component (b2): | 3 parts by weight in total |
| 2,2'-Bis(o-methoxyphenyl)-4,4',5,5'-tetraphenyl-1,1'-bi(1H-imidazole) (manufactured by Tokyo Chemical Industry Co., Ltd., abbreviation: HABI-Me): | 3 parts by weight |

(4) Measurement of Surface Tension of Curable Composition (A2-1')

The surface tension of the curable composition (A2-1') was measured in the same manner as in Example 1. As a result, the surface tension was 33.4 mN/m.

(5) Calculation of Solubility Parameter

The Hansen solubility parameters of the component (a1) in the curable composition (A1-1'), the curable composition (A2-1'), and the components (a2) and (b2) in the curable composition (A2-1') were calculated with the calculation software HSPiP in the same manner as in Example 1. The results of the calculation are shown in Table 3 to Table 5.

The Ra((a1)–(A2-1')) represented by the formula (1) was calculated by using those values. As a result, the Ra((a1)–(A2-1')) was 11.2, and hence it was expected that sufficient mixing of the component (a1) and the curable composition (A2-1') was not obtained.

Next, the formula (2) minus the formula (3), i.e., Ra((a2)–(b2))–Ra((a1)–(b2)) was calculated. As a result, the Ra((a2)–(b2))–Ra((a1)–(b2)) was −10.2. The foregoing means that the relationship represented by the formula (4) is not satisfied. It was expected that the component (b2) had such a property as to hardly dissolve in the component (a1), and hence their quick mixing was not obtained.

(6) Photo-Nanoimprint Process

As in Example 1, the surface tension of the curable composition (A1-1') arranged in the lower layer is higher than the surface tension of the curable composition (A2-1') dispensed dropwise in the upper layer, and hence the Marangoni effect is expressed and the expansion (prespread) of the droplets of the curable composition (A2-1') is quick.

However, the component (b2) does not quickly mix with the component (a1), and hence in the light irradiating step, a region having a high concentration of the curable composition (A1-1') does not satisfactorily cure.

(7) Etching Process

A cured film was subjected to dry etching with a dry etching apparatus. As a result, the cured film of (A1-1') that had not satisfactorily cured was selectively etched and hence the in-plane distribution of the curable composition occurred. Accordingly, a satisfactory pattern cannot be transferred.

Comparative Example 2

(1) Preparation of Curable Composition (A1-2')

A component (a1), a component (b1), a component (c1), and a component (d1) described below were blended, and the blend was filtered with a 0.2-micrometer filter made of ultrahigh-molecular weight polyethylene to prepare a curable composition (A1-2') of Comparative Example 2.

| | |
|---|---|
| (1-1) Component (a1): | 100 parts by weight in total |
| Acrylic acid (manufactured by The Dow Chemical Company): | 100 parts by weight |
| (1-2) Component (b1): | 0 parts by weight in total |

The component (b1) was not added.

| | |
|---|---|
| (1-3) Component (c1): | 0 parts by weight in total |

The component (c1) was not added.

| | |
|---|---|
| (1-4) Component (d1): | 33,000 parts by weight in total |
| Propylene glycol monomethyl ether acetate (manufactured by Tokyo Chemical Industry Co., Ltd., abbreviation: PGMEA) | 33,000 parts by weight |

(2) Measurement of Surface Tension of Curable Composition (A1-2')

The surface tension of a composition of the components of the curable composition (A1-2') except the component (d1) serving as a solvent was measured in the same manner as in Example 1. As a result, the surface tension was 69.9 mN/m.

(3) Preparation of Curable Composition (A2-2')

A curable composition (A2-2') was obtained in the same manner as in Example 1 except that the following material was used as the component (b2).

| | |
|---|---|
| (3-2) Component (b2): | 3 parts by weight in total |
| Irgacure OXE02 (manufactured by BASF, abbreviation: I.OXE02): | 3 parts by weight |

(4) Measurement of Surface Tension of Curable Composition (A2-2')

The surface tension of the curable composition (A2-2') was measured in the same manner as in Example 1. As a result, the surface tension was 33.4 mN/m.

(5) Calculation of Solubility Parameter

The Hansen solubility parameters of the component (a1) in the curable composition (A1-2'), the curable composition (A2-2'), and the components (a2) and (b2) in the curable composition (A2-2') were calculated with the calculation software HSPiP in the same manner as in Example 1. The results of the calculation are shown in Table 3 to Table 5.

The Ra((a1)–(A2-2')) represented by the formula (1) was calculated by using those values. As a result, the Ra((a1)–(A2-2')) was 11.0, and hence it was expected that sufficient mixing of the component (a1) and the curable composition (A2-2') was not obtained.

Next, the formula (2) minus the formula (3), i.e., Ra((a2)–(b2))–Ra((a1)–(b2)) was calculated. As a result, the Ra((a2)–(b2))–Ra((a1)–(b2)) was −6.8. The foregoing means that the relationship represented by the formula (4) is not satisfied. It was expected that the component (b2) had such a property as to hardly dissolve in the component (a1), and hence their quick mixing was not obtained.

(6) Photo-Nanoimprint Process

As in Example 1, the surface tension of the curable composition (A1-2') arranged in the lower layer is higher than the surface tension of the curable composition (A2-2') dispensed dropwise in the upper layer, and hence the Marangoni effect is expressed and the expansion (prespread) of the droplets of the curable composition (A2-2') is quick.

However, the component (b2) does not quickly mix with the component (a1), and hence in the light irradiating step, a region having a high concentration of the curable composition (A1-2') does not satisfactorily cure.

(7) Etching Process

A cured film was subjected to dry etching with a dry etching apparatus. As a result, the cured film of (A1-2') that had not satisfactorily cured was selectively etched and hence the in-plane distribution of the curable composition occurred. Accordingly, a satisfactory pattern cannot be transferred.

Comparative Example 3

(1) Preparation of Curable Composition (A1-3')

A component (a1), a component (b1), a component (c1), and a component (d1) described below were blended, and the blend was filtered with a 0.2-micrometer filter made of ultrahigh-molecular weight polyethylene to prepare a curable composition (A1-3') of Comparative Example 3.

| | |
|---|---|
| (1-1) Component (a1): | 100 parts by weight in total |
| Acrylic acid (manufactured by The Dow Chemical Company): | 100 parts by weight |
| (1-2) Component (b1): | 0 parts by weight in total |

The component (b1) was not added.

| | |
|---|---|
| (1-3) Component (c1): | 0 parts by weight in total |

The component (c1) was not added.

| | |
|---|---|
| (1-4) Component (d1): | 33,000 parts by weight in total |
| Propylene glycol monomethyl ether acetate (manufactured by Tokyo Chemical Industry Co., Ltd., abbreviation: PGMEA): | 33,000 parts by weight |

(2) Measurement of Surface Tension of Curable Composition (A1-3')

The surface tension of a composition of the components of the curable composition (A1-3') except the component (d1) as a solvent was measured in the same manner as in Example 1. As a result, the surface tension was 69.6 mN/m.

(3) Preparation of Curable Composition (A2-3')

A curable composition (A2-3') was obtained in the same manner as in Example 1 except that the following material was used as the component (b2).

| | |
|---|---|
| (3-2) Component (b2): | 3 parts by weight in total |
| Irgacure OXE01 (manufactured by BASF, abbreviation: I.OXE01): | 3 parts by weight |

(4) Measurement of Surface Tension of Curable Composition (A2-3')

The surface tension of the curable composition (A2-3') was measured in the same manner as in Example 1. As a result, the surface tension was 33.4 mN/m.

(5) Calculation of Solubility Parameter

The Hansen solubility parameters of the component (a1) in the curable composition (A1-3'), the curable composition (A2-3'), and the components (a2) and (b2) in the curable composition (A2-3') were calculated with the calculation software HSPiP in the same manner as in Example 1. The results of the calculation are shown in Table 3 to Table 5.

The Ra((a1)–(A2-3')) represented by the formula (1) was calculated by using those values. As a result, the Ra((a1)–(A2-3')) was 11.0, and hence it was expected that sufficient mixing of the component (a1) and the curable composition (A2-3') was not obtained.

Next, the formula (2) minus the formula (3), i.e., Ra((a2)–(b2))–Ra((a1)–(b2)) was calculated. As a result, the Ra((a2)–(b2))–Ra((a1)–(b2)) was −7.8. The foregoing means that the relationship represented by the formula (4) is not satisfied. It was expected that the component (b2) had such a property as to hardly dissolve in the component (a1), and hence their quick mixing was not obtained.

(6) Photo-Nanoimprint Process

As in Example 1, the surface tension of the curable composition (A1-3') arranged in the lower layer is higher than the surface tension of the curable composition (A2-3') dispensed dropwise in the upper layer, and hence the Marangoni effect is expressed and the expansion (prespread) of the droplets of the curable composition (A2-3') is quick.

However, the component (b2) does not quickly mix with the component (a1), and hence in the light irradiating step, a region having a high concentration of the curable composition (A1-3') does not satisfactorily cure.

(7) Etching Process

A cured film was subjected to dry etching with a dry etching apparatus. As a result, the cured film of (A1-3') that had not satisfactorily cured was selectively etched and hence the in-plane distribution of the curable composition occurred. Accordingly, a satisfactory pattern cannot be transferred.

SUMMARY OF EXAMPLES AND COMPARATIVE EXAMPLES

The composition tables of Examples 1 to 5 and Comparative Examples 0 to 3 are collectively shown in Table 1 and Table 2, Hansen solubility parameters are collectively shown in Tables 3 to 5, and the effects of the invention are collectively shown in Table 6.

TABLE 1

| Composition table of curable composition (A1) (part(s) by weight) | | | | |
|---|---|---|---|---|
| | Component (a1) | Component (b1) | Component (c1) | Component (d1) |
| Example 1 | mXDA (100) | Absent | Absent | PGMEA (33,000) |
| Example 2 | | | | |
| Example 3 | TMPTA (100) | | | |
| Example 4 | DCP-A (100) | | | |
| Example 5 | PET-3 (100) | | | |
| Comparative Example 0 | (Curable composition (A1) was not used) | | | |
| Comparative Example 1 | Acrylic acid (100) | Absent | Absent | PGMEA (33,000) |
| Comparative Example 2 | | | | |
| Comparative Example 3 | | | | |

TABLE 2

| Composition table of curable composition (A2) (part(s) by weight) | | | | |
|---|---|---|---|---|
| | Component (a2) | Component (b2) | Component (c2) | Component (d2) |
| Example 1 | IB-XA (9) | I.369 (3) | Absent | Absent |
| Example 2 | V#160 (38) | ITPO-L (3) | | |
| Example 3 | NP-A (47) | I.1173. (3) | | |
| Example 4 | | N.1717 (3) | | |
| Example 5 | | I.1173 (3) | | |
| Comparative Example 0 | | I.369 (3) | | |
| Comparative Example 1 | | HABI-Me (3) | | |
| Comparative Example 2 | | I.OXE02 (3) | | |
| Comparative Example 3 | | I.OXE01 (3) | | |

TABLE 3

| Hansen solubility parameter of component (a1) in curable composition (A1) | | | |
|---|---|---|---|
| | Component (a1) | | |
| | δd | δp | δh |
| Example 1 | 18.1 | 4.7 | 5.9 |
| Example 2 | | | |
| Example 3 | 16.7 | 4.3 | 6.2 |
| Example 4 | 17.3 | 3.3 | 4.1 |
| Example 5 | 17.0 | 6.5 | 10.0 |
| Comparative Example 1 | 16.2 | 7.8 | 15.5 |
| Comparative Example 2 | | | |
| Comparative Example 3 | | | |

TABLE 4

| Hansen solubility parameter of component (a2) in curable composition (A2) | | | |
|---|---|---|---|
| | Component (a2) | | |
| | δd | δp | δh |
| Common to Examples 1 to 5 and Comparative Examples 0 to 3 | 17.0 | 4.1 | 5.3 |

TABLE 5

| Hansen solubility parameters of component (b2) in curable composition (A2) and curable composition (A2) | | | | | | |
|---|---|---|---|---|---|---|
| | Component (b2) | | | Curable composition (A2) | | |
| | δd | δp | δh | δd | δp | δh |
| Example 1 | 18.9 | 7.4 | 4.3 | 17.1 | 4.2 | 5.3 |
| Example 2 | 19.4 | 7.5 | 4.2 | 17.1 | 4.2 | 5.3 |
| Example 3 | 18.4 | 7.5 | 8.1 | 17.0 | 4.2 | 5.4 |
| Example 4 | 20.0 | 4.3 | 1.3 | 17.1 | 4.1 | 5.2 |
| Example 5 | 18.4 | 7.5 | 8.1 | 17.0 | 4.2 | 5.4 |
| Comparative Example 1 | 19.6 | 1.3 | 0 | 17.1 | 4.0 | 5.1 |
| Comparative Example 2 | 19.6 | 9.1 | 2.8 | 17.1 | 4.3 | 5.2 |
| Comparative Example 3 | 18.7 | 8.9 | 1.7 | 17.1 | 4.2 | 5.2 |

TABLE 6

| Results of examples and comparative examples | | | | | | |
|---|---|---|---|---|---|---|
| | Composition (A1) Surface tension (mN/m) | Composition (A2) Surface tension (mN/m) | Formula (1) | Formula (2)-Formula (3) | Prespread | Influence of in-plane distribution |
| Example 1 | 39.3 | 33.4 | 2.2 | 1.6 | Fast | Absent |
| Example 2 | | 33.4 | 2.2 | 1.8 | Fast | Absent |
| Example 3 | 36.4 | 33.4 | 1.1 | 0.2 | Fast | Absent |
| Example 4 | 38.6 | 33.4 | 1.4 | 1.0 | Fast | Absent |
| Example 5 | 39.6 | 33.4 | 5.2 | 1.7 | Fast | Absent |
| Comparative Example 0 | (Composition (A1) was not used) | 33.4 | 8.9 | | Standard | Absent |
| Comparative Example 1 | 69.9 | 33.4 | 11.2 | −10.2 | Fast | Present |
| Comparative Example 2 | | 33.4 | 11.0 | −6.8 | Fast | Present |
| Comparative Example 3 | | 33.4 | 11.0 | −7.8 | Fast | Present |

In Table 6, the evaluation of the prespread was a relative evaluation with reference to Comparative Example 0. In other words, the prespread was evaluated as being "fast" when its speed was faster than that of Comparative Example 0, and the prespread was evaluated as being "slow" when its speed was on the same level with that of Comparative Example 0 or slower than that of Comparative Example 0. The prespread of each of Examples 1 to 5 and Comparative Examples 1 to 3 is faster than that of Comparative Example 0, in other words, the case where the curable composition (A1) is not used by virtue of the Marangoni effect.

In each of Examples 1 to 5 and Comparative Example 0, influences of the in-plane distributions of various characteristics such as dry etching resistance, resulting from a mixing failure between the composition A1 and the composition A2 are absent. In each of Comparative Examples to 3, owing to the presence of an influence of the dry etching resistance caused by the mixing failure, there arises a problem in that the in-plane distributions of the various characteristics occur.

As described above, it was shown that in each of Examples 1 to 5, high-speed prespread was obtained without the influences of the in-plane distributions of the various characteristics.

As described above, the use of the method of this embodiment can provide a SST-NIL technology suppressed in in-plane distribution through the use of two kinds of liquid curable compositions that satisfactorily mix with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of U.S. Provisional Patent Application No. 62/315,738, filed Mar. 31, 2016, which is hereby incorporated by reference herein in its entirety.

What is claimed is:

1. A pattern forming method, comprising in this order:

dispensing a droplet of an imprint resist discretely onto a liquid film of an imprint pretreatment coating material on a substrate such that the droplet is spread on the liquid film of the imprint pretreatment coating material to yield a spread imprint resist, wherein the imprint pretreatment coating material comprises a curable composition (A1) containing at least a component (a1) serving as a polymerizable compound and the imprint resist comprises a curable composition (A2) containing at least a component (a2) serving as a polymerizable compound and a component (b2) serving as a photopolymerization initiator;

contacting the spread imprint resist with a mold; and polymerizing the spread imprint resist and the imprint pretreatment coating material to yield a cured layer on the substrate, wherein a distance in Hansen space Ra((a1)−(A2)) between the component (a1) and the curable composition (A2) is 6 or less.

2. The pattern forming method according to claim 1, wherein the distance in Hansen space Ra((a1)−(A2)) between the component (a1) and the curable composition (A2) is 3 or less.

3. The pattern forming method according to claim 1, wherein a content of a component (b1) serving as a photopolymerization initiator in the curable composition (A1) is less than 0.1 wt % with respect to a total weight of a composition of components of the curable composition (A1) except a solvent.

4. The pattern forming method according to claim 1, wherein a surface tension of a composition of components of the curable composition (A1) except a solvent is higher than a surface tension of a composition of components of the curable composition (A2) except a solvent.

5. The pattern forming method according to claim 1, wherein a viscosity of a composition of components of the curable composition (A1) except a solvent is 1 m·Pas to 1,000 m·Pas, and a viscosity of a composition of components of the curable composition (A2) except a solvent is 1 mPa·s to 12 mPa·s.

6. The pattern forming method according to claim 1, wherein a material for a surface of the mold comprises quartz.

7. The pattern forming method according to claim 1, wherein the contacting of the spread imprint resist with the mold is performed under an atmosphere containing a condensable gas.

8. The pattern forming method according to claim 7, wherein the dispensing is performed under an atmosphere of a mixed gas containing the condensable gas and a non-condensable gas.

9. The pattern forming method according to claim 8, wherein the non-condensable gas is helium.

10. The pattern forming method according to claim 7, wherein the condensable gas is 1,1,1,3,3-pentafluoropropane.

11. A method of producing a processed substrate, comprising the pattern forming method of claim 1.

12. A method of producing an optical component, comprising the pattern forming method of claim 1.

13. A method of producing a quartz mold replica, comprising the pattern forming method of claim 1.

14. The pattern forming method according to claim 1, wherein the pattern comprises a nanosize groove/land pattern based on a photocured product of the curable compositions (A1) and (A2).

15. A pattern forming method, comprising in this order:

dispensing a droplet of an imprint resist discretely onto a liquid film of an imprint pretreatment coating material on a substrate such that the droplet is spread on the liquid film of the imprint pretreatment coating material to yield a spread imprint resist, wherein the imprint pretreatment coating material comprises a curable composition (A1) containing at least a component (a1) serving as a polymerizable compound and the imprint resist comprises a curable composition (A2) containing at least a component (a2) serving as a polymerizable compound and a component (b2) serving as a photopolymerization initiator;

contacting the spread imprint resist with a mold; and polymerizing the spread imprint resist and the imprint pretreatment coating material to yield a cured layer on the substrate, wherein a distance in Hansen space Ra((a1)−(b2)) between the component (b2) and the component (a1) is smaller than a distance in Hansen space Ra((a2)−(b2)) between the component (b2) and the component (a2).

16. The pattern forming method according to claim 15, wherein a content of a component (b1) serving as a photopolymerization initiator in the curable composition (A1) is less than 0.1 wt % with respect to a total weight of a composition of components of the curable composition (A1) except a solvent.

17. The pattern forming method according to claim 15, wherein a surface tension of a composition of components of the curable composition (A1) except a solvent is higher than a surface tension of a composition of components of the curable composition (A2) except a solvent.

18. The pattern forming method according to claim 15, wherein a viscosity of a composition of components of the curable composition (A1) except a solvent is 1 mPa·s to 1,000 mPa·s, and a viscosity of a composition of components of the curable composition (A2) except a solvent is 1 mPa·s to 12 mPa·s.

19. The pattern forming method according to claim 15, wherein a material for a surface of the mold comprises quartz.

20. The pattern forming method according to claim 15, wherein the contacting of the spread imprint resist with the mold is performed under an atmosphere containing a condensable gas.

21. A method of producing a processed substrate, comprising the pattern forming method of claim 15.

22. A method of producing an optical component, comprising the pattern forming method of claim 15.

23. A method of producing a quartz mold replica, comprising the pattern forming method of claim 15.

24. The pattern forming method according to claim 15, wherein the pattern comprises a nanosize groove/land pattern based on a photocured product of the curable compositions (A1) and (A2).

25. A method for manufacturing a semiconductor device, the method comprising:

providing a liquid film of an imprint pretreatment coating material on a substrate, wherein the imprint pretreatment coating material comprises a curable composition (A1) containing at least a component (a1) serving as a polymerizable compound;

dispensing a droplet of an imprint resist onto the liquid film of the imprint pretreatment coating material such that the droplet is spread on the liquid film of the imprint pretreatment coating material to yield a spread imprint resist, wherein the imprint resist comprises a curable composition (A2) containing at least a component (a2) serving as a polymerizable compound and a component (b2) serving as a photopolymerization initiator;

contacting the spread imprint resist with a mold;

polymerizing the spread imprint resist and the imprint pretreatment coating material to yield a cured layer on the substrate;

separating the mold from the cured layer; and etching the substrate via the cured layer;

wherein a distance in Hansen space Ra((a1)–(A2)) between the component (a1) and the curable composition (A2) is 6 or less.

26. The method according to claim 25, wherein:

the providing of the liquid film of the imprint pretreatment coating material comprises coating the substrate using an inkjet method, dip coating, air knife coating, curtain coating, wire bar coating, gravure coating, extrusion coating, spin coating, or a slit scan method; and the droplet of the imprint resist is dispensed onto the liquid film of the imprint pretreatment coating material using an ink jet method.

* * * * *